(12) United States Patent
Zhang et al.

(10) Patent No.: US 11,723,246 B2
(45) Date of Patent: Aug. 8, 2023

(54) DISPLAY PANEL, PREPARATION METHOD THEREOF AND DISPLAY DEVICE

(71) Applicant: BOE Technology Group Co., Ltd., Beijing (CN)

(72) Inventors: Jie Zhang, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 306 days.

(21) Appl. No.: 17/263,257

(22) PCT Filed: Jul. 23, 2020

(86) PCT No.: PCT/CN2020/103831
§ 371 (c)(1),
(2) Date: Jan. 26, 2021

(87) PCT Pub. No.: WO2021/103604
PCT Pub. Date: Jun. 3, 2021

(65) Prior Publication Data
US 2022/0302240 A1    Sep. 22, 2022

(30) Foreign Application Priority Data

Nov. 29, 2019 (CN) .......................... 201911205633.5

(51) Int. Cl.
*H01L 27/32* (2006.01)
*H10K 59/131* (2023.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC .. G09G 3/3233; G09G 3/3241; G09G 3/3266; G09G 2300/0426;
(Continued)

(56) References Cited

U.S. PATENT DOCUMENTS

2019/0303637 A1   10/2019   Wang et al.
2020/0119120 A1   4/2020    Feng et al.

FOREIGN PATENT DOCUMENTS

CN    107170752 A    9/2017
CN    108461529 A    8/2018
(Continued)

*Primary Examiner* — Stacy Khoo
(74) *Attorney, Agent, or Firm* — ArentFox Schiff LLP; Michael Fainberg

(57) ABSTRACT

The present disclosure discloses a display panel, a preparation method thereof and a display device. A first conducting layer includes a first electrode layer, a second conducting layer includes a second electrode layer, a third conducting layer includes a third electrode layer, an orthographic projection of the first electrode layer on a base substrate, an orthographic projection of the second electrode layer on the base substrate and an orthographic projection of the third electrode layer on the base substrate have an overlap region with one another, in this way, the first electrode layer and the third electrode layer may be electrically connected with each other to serve as one electrode of a storage capacitor, the second electrode layer may serve as another electrode of the storage capacitor, thus the storage capacitor may be formed in a sandwich capacitor mode, and a capacitance value of the storage capacitor may be increased.

19 Claims, 14 Drawing Sheets

(51) Int. Cl.
  *G09G 3/3233* (2016.01)
  *G09G 3/3266* (2016.01)
  *H10K 71/00* (2023.01)
  *H10K 59/12* (2023.01)
  *H10K 59/121* (2023.01)

(52) U.S. Cl.
  CPC ..... *H10K 71/00* (2023.02); *G09G 2300/0426* (2013.01); *G09G 2300/0819* (2013.01); *G09G 2300/0842* (2013.01); *G09G 2300/0861* (2013.01); *G09G 2310/0286* (2013.01); *H10K 59/1201* (2023.02); *H10K 59/1216* (2023.02)

(58) Field of Classification Search
  CPC ... G09G 2300/0819; G09G 2300/0842; G09G 2300/0861; G09G 2310/0286; G09G 3/3225; H01L 27/124; H01L 27/1255; H01L 27/1259; H01L 27/3265; H01L 27/3276; H01L 51/56; H01L 2227/323; G11C 19/28
  See application file for complete search history.

(56) References Cited

FOREIGN PATENT DOCUMENTS

| | | |
|---|---|---|
| CN | 208141716 U | 11/2018 |
| CN | 208861649 U | 5/2019 |
| CN | 110767665 A | 2/2020 |

DISPLAY PANEL, PREPARATION METHOD THEREOF AND DISPLAY DEVICE

CROSS REFERENCE TO RELATED APPLICATIONS

The present disclosure is a National Stage of International Application No. PCT/CN2020/103831, filed Jul. 23, 2020, which claims the priority to the Chinese patent application No. 201911205633.5, filed on Nov. 29, 2019 to the China Patent Office, both of which are entirely incorporated herein by reference.

FIELD

The present disclosure relates to the field of display technology, in particular to a display panel, a preparation method thereof and a display device.

BACKGROUND

With the rapid development of a display technology, various types of display panels have gradually entered the market and been widely applied. For example, the display panels may be configured in various intelligent terminals such as mobile phones, tablet computers, televisions, smart wearables, and information inquiry machines in public places and halls to better realize man-machine interaction. Generally, the display panels are internally provided with circuits, and the circuits are usually provided with storage capacitors. Because the storage capacitors need to realize functions of storage and voltage stabilization, the storage capacitors occupy a large region, which leads to the reduction of space for other components arranged in the display panels. Thus, how to reduce the occupied region of the storage capacitors without reducing capacitance values of the storage capacitors is an urgent technical problem to be solved for those skilled in the art.

SUMMARY

An embodiment of the present disclosure provide a display panel, including a base substrate and a driving circuit and further including a first conducting layer, a second conducting layer and a third conducting layer, wherein the driving circuit is located on the base substrate and includes a storage capacitor, the first conducting layer, the second conducting layer and the third conducting layer are sequentially located on the base substrate in a stacked mode, and the first conducting layer, the second conducting layer and the third conducting layer are arranged on different layers.

The first conducting layer includes a first electrode layer, the second conducting layer includes a second electrode layer, and the third conducting layer includes a third electrode layer.

An orthographic projection of the first electrode layer on the base substrate, an orthographic projection of the second electrode layer on the base substrate and an orthographic projection of the third electrode layer on the base substrate have an overlap region with one another.

The first electrode layer and the third electrode layer are electrically connected with each other to serve as a first electrode of the storage capacitor, and the second electrode layer serves as a second electrode of the storage capacitor.

Optionally, in the embodiment of the present disclosure, the display panel further includes: a first insulating layer located between the first conducting layer and the second conducting layer, a second insulating layer located between the second conducting layer and the third conducting layer, a third insulating layer located on the side, away from the base substrate, of the third conducting layer, and a fourth conducting layer located on the side, away from the base substrate, of the third insulating layer.

The second conducting layer includes a first connecting lead insulated from the second electrode layer, and the fourth conducting layer includes a second connecting lead.

One end of the second connecting lead is electrically connected with the third electrode layer through first via holes penetrating through the third insulating layer, the other end of the second connecting lead is electrically connected with the first connecting lead through second via holes penetrating through the second insulating layer and the third insulating layer, and the first connecting lead is electrically connected with the first electrode layer through third via holes penetrating through the first insulating layer, so that the first electrode layer and the third electrode layer are electrically connected through the first connecting lead and the second connecting lead.

Optionally, in the embodiment of the present disclosure, the number of the first via holes is at least two; and/or, the number of the second via holes is at least two; and/or, the number of the third via holes is at least two.

Optionally, in the embodiment of the present disclosure, an orthographic projection of the second via holes on the base substrate and an orthographic projection of the third via holes on the base substrate are not overlapped with each other.

Optionally, in the embodiment of the present disclosure, the display panel further includes: a scanning driving circuit and a light-emitting control circuit located in a non-display area and a pixel circuit located in a display area.

The driving circuit is at least one of the scanning driving circuit, the light-emitting control circuit and the pixel circuit.

Optionally, in the embodiment of the present disclosure, the display panel further includes: a plurality of light-emitting control signal lines located in the display area and a plurality of light-emitting control signal transmission lines located in the non-display area, each light-emitting control signal transmission line is electrically connected with the corresponding light-emitting control signal line, and a first signal output end of the light-emitting control circuit is electrically connected with each light-emitting control signal transmission line.

The light-emitting control signal transmission lines are located at the first conducting layer.

Optionally, in the embodiment of the present disclosure, the first insulating layer includes a buffer layer located between the first conducting layer and the second conducting layer and a gate insulating layer located between the buffer layer and the second conducting layer.

The second conducting layer includes a third connecting lead, the light-emitting control circuit comprises a light-emitting control transistor, an output end of the light-emitting control transistor is electrically connected with the third connecting lead through fourth via holes penetrating through the second insulating layer and the third insulating layer, and the third connecting lead is electrically connected with the light-emitting control signal transmission lines through fifth via holes penetrating through the buffer layer and the gate insulating layer, so that the light-emitting control signal transmission lines are electrically connected with the output end of the light-emitting control transistor through the third connecting lead.

Optionally, in the embodiment of the present disclosure, the number of the fourth via holes is at least two; and/or, the number of the fifth via holes is at least two; and/or, an orthographic projection of the fourth via holes on the base substrate and an orthographic projection of the fifth via holes on the base substrate are not overlapped with each other.

Optionally, in the embodiment of the present disclosure, the display panel further includes: a first signal driving line and a first transmission line located in the non-display area, the first signal driving line is located at the fourth conducting layer, and the first transmission line is electrically connected with the light-emitting control circuit.

The first transmission line includes a first sub-transmission line and a second sub-transmission line, the first sub-transmission line is located at the first conducting layer, and the second sub-transmission line is located at the second conducting layer.

The first signal driving line is electrically connected with the second sub-transmission line through sixth via holes penetrating through the second insulating layer and the third insulating layer, and the second sub-transmission line is electrically connected with the first sub-transmission line through seventh via holes penetrating through the first insulating layer, so that the first signal driving line is electrically connected with the light-emitting control circuit through the first sub-transmission line and the second sub-transmission line.

Optionally, in the embodiment of the present disclosure, the number of the sixth via holes is at least two; and/or the number of the seventh via holes is at least two; and/or an orthographic projection of the sixth via holes on the base substrate and an orthographic projection of the seventh via holes on the base substrate are not overlapped with each other.

Optionally, in the embodiment of the present disclosure, the light-emitting control transistor is a double-gate transistor, and the light-emitting control transistor includes a first bottom gate and a first top gate electrically connected with each other.

The first bottom gate is located at the first conducting layer, and the first top gate is located at the second conducting layer.

Optionally, in the embodiment of the present disclosure, the display panel further includes: a second signal driving line and a second transmission line located in the non-display area.

The second transmission line comprises a third sub-transmission line and a fourth sub-transmission line, the third sub-transmission line is located at the first conducting layer, and the fourth sub-transmission line is located at the second conducting layer.

The second signal driving line is electrically connected with the fourth sub-transmission line through eighth via holes penetrating through the second insulating layer and the third insulating layer, and the fourth sub-transmission line is electrically connected with the third sub-transmission line through ninth via holes penetrating through the first insulating layer, so that the second signal driving line is electrically connected with the scanning driving circuit through the third sub-transmission line and the fourth sub-transmission line.

Optionally, in the embodiment of the present disclosure, the number of the eighth via holes is at least two; and/or the number of the ninth via holes is at least two; and/or an orthographic projection of the eighth via holes on the base substrate and an orthographic projection of the ninth via holes on the base substrate are not overlapped with each other.

Optionally, in the embodiment of the present disclosure, the scanning driving circuit includes a scanning driving transistor.

The scanning driving transistor is a double-gate transistor, and the scanning driving transistor includes a second bottom gate and a second top gate electrically connected with each other.

The second bottom gate is located at the first conducting layer, and the second top gate is located at the second conducting layer.

Optionally, in the embodiment of the present disclosure, the light-emitting control circuit is located on the side, away from the display area, of the scanning driving circuit, and an orthographic projection of the light-emitting control signal transmission lines on the base substrate and an orthographic projection of the scanning driving circuit on the base substrate have an overlap region with each other.

An embodiment of the present disclosure further provides a display device, including the above display panel.

An embodiment of the present disclosure further provides a preparation method of the above display panel, including: forming a first conducting layer, a second conducting layer and a third conducting layer on a base substrate in sequence to form a driving circuit located on the base substrate; wherein the first conducting layer includes a first electrode layer, the second conducting layer includes a second electrode layer, and the third conducting layer includes a third electrode layer; an orthographic projection of the first electrode layer on the base substrate, an orthographic projection of the second electrode layer on the base substrate and an orthographic projection of the third electrode layer on the base substrate have an overlap region with one another; and the first electrode layer and the third electrode layer are electrically connected with each other to serve as a first electrode of a storage capacitor, and the second electrode layer serves as a second electrode of the storage capacitor.

Optionally, in the embodiment of the present disclosure, the second conducting layer includes a first connecting lead insulated from the second electrode layer; after the first conducting layer is formed and before the second conducting layer is formed, the preparation method further includes: forming a first insulating layer with third via holes, wherein the first connecting lead is electrically connected with the first electrode layer through the third via holes penetrating through the first insulating layer; after the second conducting layer is formed and before the third conducting layer is formed, the preparation method further includes: forming a second insulating layer; and after the third conducting layer is formed, the preparation method further includes: forming a third insulating layer, first via holes penetrating through the third insulating layer and second via holes penetrating through the second insulating layer and the third insulating layer; and forming a fourth conducting layer, wherein the fourth conducting layer includes a second connecting lead, one end of the second connecting lead is electrically connected with the third electrode layer through the first via holes, and the other end of the second connecting lead is electrically connected with the first connecting lead through the second via holes.

DETAILED DESCRIPTION OF THE EMBODIMENTS

Figure 1:
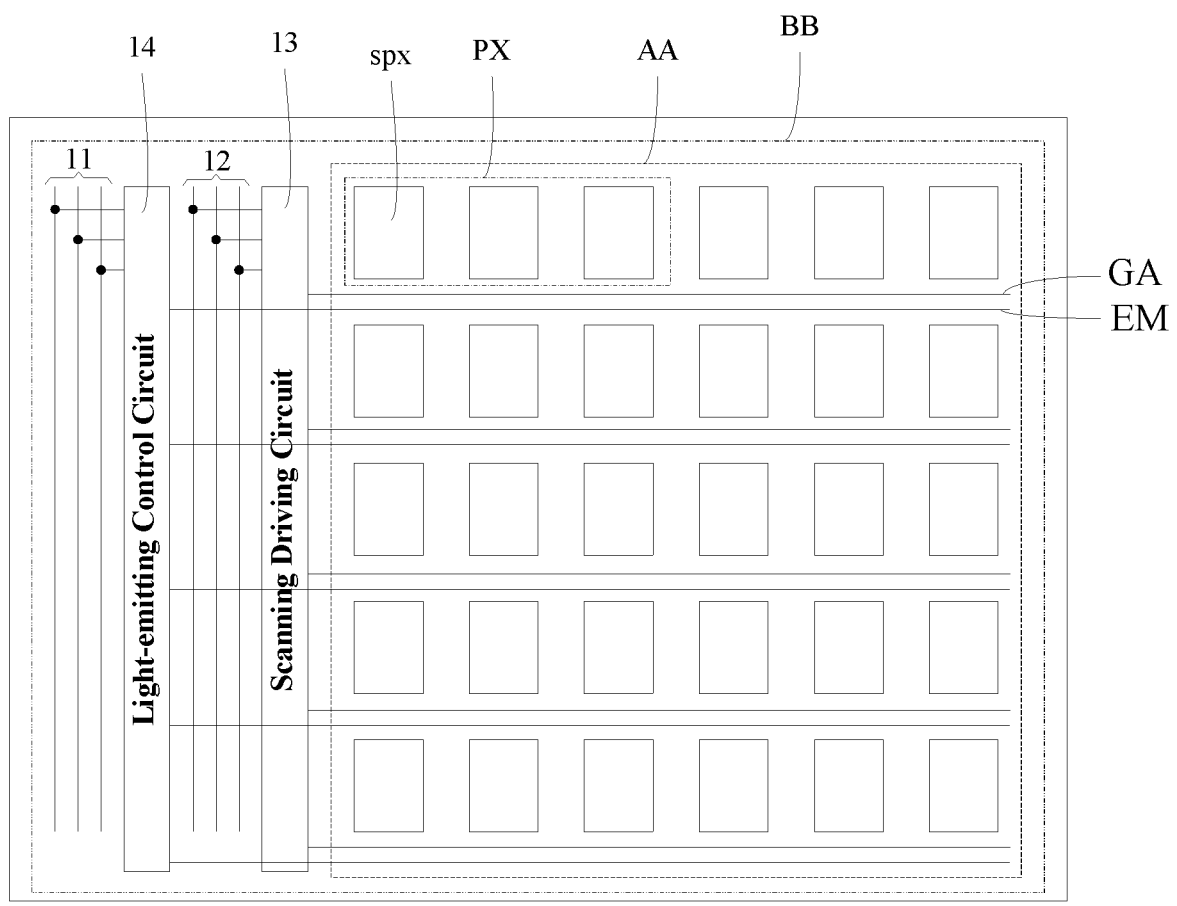
FIG. 1 is a schematic structural diagram of a display panel provided by an embodiment of the present disclosure.

In order to make objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only part of the embodiments of the present disclosure, not all of the embodiments. In the absence of conflicts, the embodiments in the present disclosure and features in embodiments may be combined with each other. Based on the described embodiments of the present disclosure, all other embodiments obtained by those of ordinary skill in the art without creative labor are within the scope of protection in the present disclosure.

Unless otherwise defined, technical or scientific terms used in the present disclosure shall be in the common sense understood by those of ordinary skill in the art to which the disclosure belongs. "First", "second" and similar terms used in the present disclosure do not imply any order, number, or importance, but are only configured to distinguish different components. "Include" or "contain" or other similar words means that an element or item preceding the words includes an element or item listed after the words and the equivalents thereof without excluding other elements or items. "Connect" or "couple" or other similar words are not restricted to physical or mechanical connection, but may include electrical connection, whether directly or indirectly.

It should be noted that dimensions and shapes of figures in the accompanying drawings do not reflect true scales, but are only intended to indicate contents of the present disclosure. The same or similar labels denote the same or similar elements or elements with the same or similar functions from beginning to end.

During specific implementation, in the embodiment of the present disclosure, a display panel may include: a base substrate 10, and a driving circuit located on the base substrate 10 and including a storage capacitor. The display panel further includes a first conducting layer 100, a second conducting layer 200 and a third conducting layer 300 which are sequentially located on the base substrate 10 in a stacked mode. The first conducting layer 100, the second conducting layer 200 and the third conducting layer 300 are arranged on different layers. And, the first conducting layer 100 includes a first electrode layer, the second conducting layer 200 includes a second electrode layer, and the third conducting layer 300 includes a third electrode layer. An orthographic projection of the first electrode layer on the base substrate 10, an orthographic projection of the second electrode layer on the base substrate 10 and an orthographic projection of the third electrode layer on the base substrate 10 have an overlap region with one another. And, the first electrode layer and the third electrode layer are electrically connected with each other to serve as a first electrode of the storage capacitor, and the second electrode layer serves as a second electrode of the storage capacitor.

According to the driving circuit provided by the embodiment of the present disclosure, the first conducting layer includes the first electrode layer, the second conducting layer includes the second electrode layer, the third conducting layer includes the third electrode layer, the orthographic projection of the first electrode layer on the base substrate, and the orthographic projection of the second electrode layer on the base substrate and the orthographic projection of the third electrode layer on the base substrate have an overlap region with one another. In this way, the first electrode layer and the third electrode layer may be electrically connected with each other to serve as one electrode of the storage capacitor, the second electrode layer may serve as another electrode of the storage capacitor, thus the storage capacitor may be formed in a sandwich capacitor mode, and a capacitance value of the storage capacitor may be increased.

In other words, the first electrode layer and the second electrode layer may have an overlap region with each other to form one sub-capacitor of the storage capacitor, and the second electrode layer and the third electrode layer have an overlap region with each other to form another sub-capacitor of the storage capacitor. The two sub-capacitors form the storage capacitor in a parallel-connection, so that the capacitance value of the storage capacitor is increased.

According to a formula which the capacitance value C of the storage capacitor meets: $C=\varepsilon S/4\pi kd$, it can be known that if the capacitance value of the storage capacitor is a fixed value, the capacitance value of the storage capacitor may be increased because the storage capacitor is formed in the sandwich capacitor mode, thus in the case that the capacitance value is fixed, an overlap region S of the storage capacitor may be decreased, thus the occupied region of the first electrode layer, the second electrode layer and the third electrode layer which form the storage capacitor on the base substrate 10 may be decreased, and then space occupied by the storage capacitor may be saved. Further, the occupied region of the storage capacitor is decreased so that the space can be avoided; after the avoided space is integrated, other elements may be arranged, for example, the sub-pixels spx may be set, and thus the resolution ratio of the display panel may be increased, or, a sensor may be arranged to improve induction capacity and the like of the display panel.

During specific implementation, as shown in FIG. 1, the display panel may include a display area AA. The display area AA may include a plurality of pixel units PX. Each pixel unit PX may include a plurality of sub-pixels spx. Exemplarily, the pixel unit PX may include a red sub-pixel, a green sub-pixel and a blue sub-pixel, and in this way, the red, green and blue may be mixed to realize color display. Or, the pixel unit PX may further include a red sub-pixel, a green sub-pixel, a blue sub-pixel and a white sub-pixel, and in this way, the red, green, blue and white may be mixed to realize color display. Of course, in practical applications, the emission color of the sub-pixels spx in the pixel units PX may be designed and determined according to an actual application environment, which is not limited herein.

During specific implementation, the display panel may be an electroluminescent display panel. In the embodiment of the present disclosure, the sub-pixel spx may include the light-emitting element and the pixel circuit configured to drive the light-emitting element to emit light. The light-emitting element includes the anode, the light-emitting layer and the cathode which are arranged in a stacked mode. Further, the light-emitting element may include at least one of the organic light emitting diode (OLED) and the quantum dot light emitting diode (QLED).

Further, during specific implementation, the display panel provided by the embodiment of the present disclosure may further include a plurality of gate lines, a plurality of light-emitting control signal lines and a plurality of data lines. Exemplarily, the pixel circuits in each line of sub-pixels spx may be electrically connected with the corresponding gate line and the corresponding light-emitting control signal line, and the pixel circuits in each column of sub-pixels spx may be electrically connected with the corresponding data line.

During specific implementation, as shown in FIG. 1, the display panel further includes a non-display area BB around the display area AA. In the embodiment of the present disclosure, in order to input scanning signals to the gate lines and input light-emitting control signals to the light-emitting control signal lines, the display panel may further include: a first signal driving line 11, a second signal driving line 12, a scanning driving circuit 13 and a light-emitting control circuit 14 which are located in the non-display area BB. The first signal driving line 11 may transmit the signal to the light-emitting control circuit 14 to drive the light-emitting control circuit 14 to generate the light-emitting control signals and provide the light-emitting control signals for the light-emitting control signal lines. The second signal driving line 12 may transmit signals to the scanning driving circuit 13 to drive the scanning driving circuit 13 to generate the scanning signals and provide the scanning signals for the gate lines.

During specific implementation, in the embodiment of the present disclosure, as shown in FIG. 1, the light-emitting control circuit 14 may be located on the side, away from the display area AA, of the scanning driving circuit 13. Of course, the light-emitting control circuit 14 may be further located on the side, facing the display area AA, of the scanning driving circuit 13, which is omitted herein.

During specific implementation, in the embodiment of the present disclosure, the driving circuit may be arranged as the light-emitting control circuit 14. In this way, the storage capacitor in the light-emitting control circuit 14 may be arranged in the sandwich capacitor mode, and thus an occupied region of the light-emitting control circuit 14 is decreased.

During specific implementation, in the embodiment of the present disclosure, the light-emitting control circuit 14 may include: a plurality of cascaded first shifting registers. The first input signal end IN1 of the first shifting register of the first-stage is electrically connected with a light-emitting trigger signal end. In the rest of the first shifting registers, the first input signal end IN1 of the first shifting register of the next-stage is electrically connected with the cascaded signal output end GP of the first shifting register of the former-stage. And, the first signal output end GO of each first shifting register is configured to output the light-emitting control signal.

Figure 2:
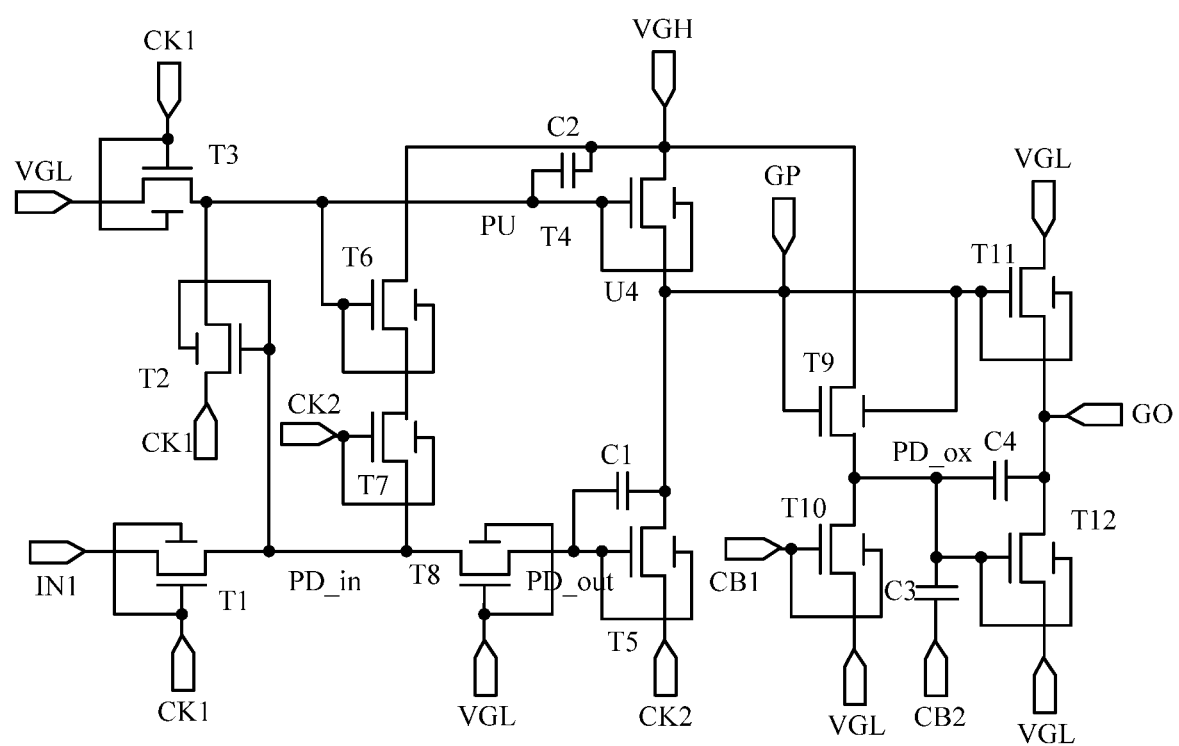
FIG. 2 is a schematic structural diagram of a light-emitting control circuit provided by an embodiment of the present disclosure.

During specific implementation, in the embodiment of the present disclosure, as shown in FIG. 2, the first shifting register may include: a first capacitor C1, a second capacitor C2, a third capacitor C3, a fourth capacitor C4 and light-emitting control transistors T1-T12. Gate of the light-emitting control transistor T1 is electrically connected with the first clock signal end CK1, the first pole of the light-emitting control transistor T1 is electrically connected with the first input signal end IN1, and the second pole of the light-emitting control transistor T1 is electrically connected with the first node PD_in.

The gate of the light-emitting control transistor T2 is electrically connected with the first node PD_in, the first pole of the light-emitting control transistor T2 is electrically connected with the first clock signal end CK1, and the second pole of the light-emitting control transistor T2 is electrically connected with the second node PU.

The gate of the light-emitting control transistor T3 is electrically connected with the first clock signal end CK1, the first pole of the light-emitting control transistor T3 is electrically connected with the first reference signal end VGL, and the second pole of the light-emitting control transistor T3 is electrically connected with the second node PU.

The gate of the light-emitting control transistor T4 is electrically connected with the second node PU, the first pole of the light-emitting control transistor T4 is electrically connected with the second reference signal end VGH, and the second pole of the light-emitting control transistor T4 is electrically connected with the fourth node U4.

The gate of the light-emitting control transistor T5 is electrically connected with the third node PD_out, the first pole of the light-emitting control transistor T5 is electrically connected with the second clock signal end CK2, and the second pole of the light-emitting control transistor T5 is electrically connected with the fourth node U4.

The gate of the light-emitting control transistor T6 is electrically connected with the second node PU, the first pole of the light-emitting control transistor T6 is electrically connected with the second reference signal end VGH, and the second pole of the light-emitting control transistor T6 is electrically connected with the first pole of light-emitting control transistor T7.

The gate of the light-emitting control transistor T7 is electrically connected with the second clock signal end CK2, and the second pole of the light-emitting control transistor T7 is electrically connected with the first nodes PD_in.

The gate of the light-emitting control transistor T8 is electrically connected with the first reference signal end VGL, the first pole of the light-emitting control transistor T8 is electrically connected with the first nodes PD_in, and the second pole of the light-emitting control transistor T8 is electrically connected with the third node PD_out.

The gate of the light-emitting control transistor T9 is electrically connected with the fourth node U4, the first pole of the light-emitting control transistor T9 is electrically connected with the second reference signal end VGH, and the second pole of the light-emitting control transistor T9 is electrically connected with the fifth node PD_ox.

The gate of the light-emitting control transistor T10 is electrically connected with the first control signal end, the first pole of the light-emitting control transistor T10 is electrically connected with the first reference signal end VGL, and the second pole of the light-emitting control transistor T10 is electrically connected with the fifth node PD_ox.

The gate of the light-emitting control transistor T11 is electrically connected with the fourth node U4, the first pole of the light-emitting control transistor T11 is electrically connected with the second reference signal end VGH, and the second pole of the light-emitting control transistor T11 is electrically connected with the first signal output end GO.

The gate of the light-emitting control transistor T12 is electrically connected with the fifth node PD_ox, the first pole of the light-emitting control transistor T12 is electrically connected with the first reference signal end VGL, and the second pole of the light-emitting control transistor T12 is electrically connected with the first signal output end GO.

The first electrode of the first capacitor C1 is electrically connected with the fourth node U4, and the second electrode of the first capacitor C1 is electrically connected with the gate of the light-emitting control transistor T5.

The first electrode of the second capacitor C2 is electrically connected with the second reference signal end VGH, and the second electrode of the second capacitor C2 is electrically connected with the gate of the light-emitting control transistor T4.

The first electrode of the third capacitor C3 is electrically connected with the second control signal end, and the second electrode of the third capacitor C3 is electrically connected with the gate of the light-emitting control transistor T12.

The first electrode of the fourth capacitor C4 is electrically connected with the first reference signal end VGL, and the second electrode of the fourth capacitor C4 is electrically connected with the gate of the light-emitting control transistor T12.

The cascade signal output end GP is electrically connected with the fourth node U4.

Figure 3:
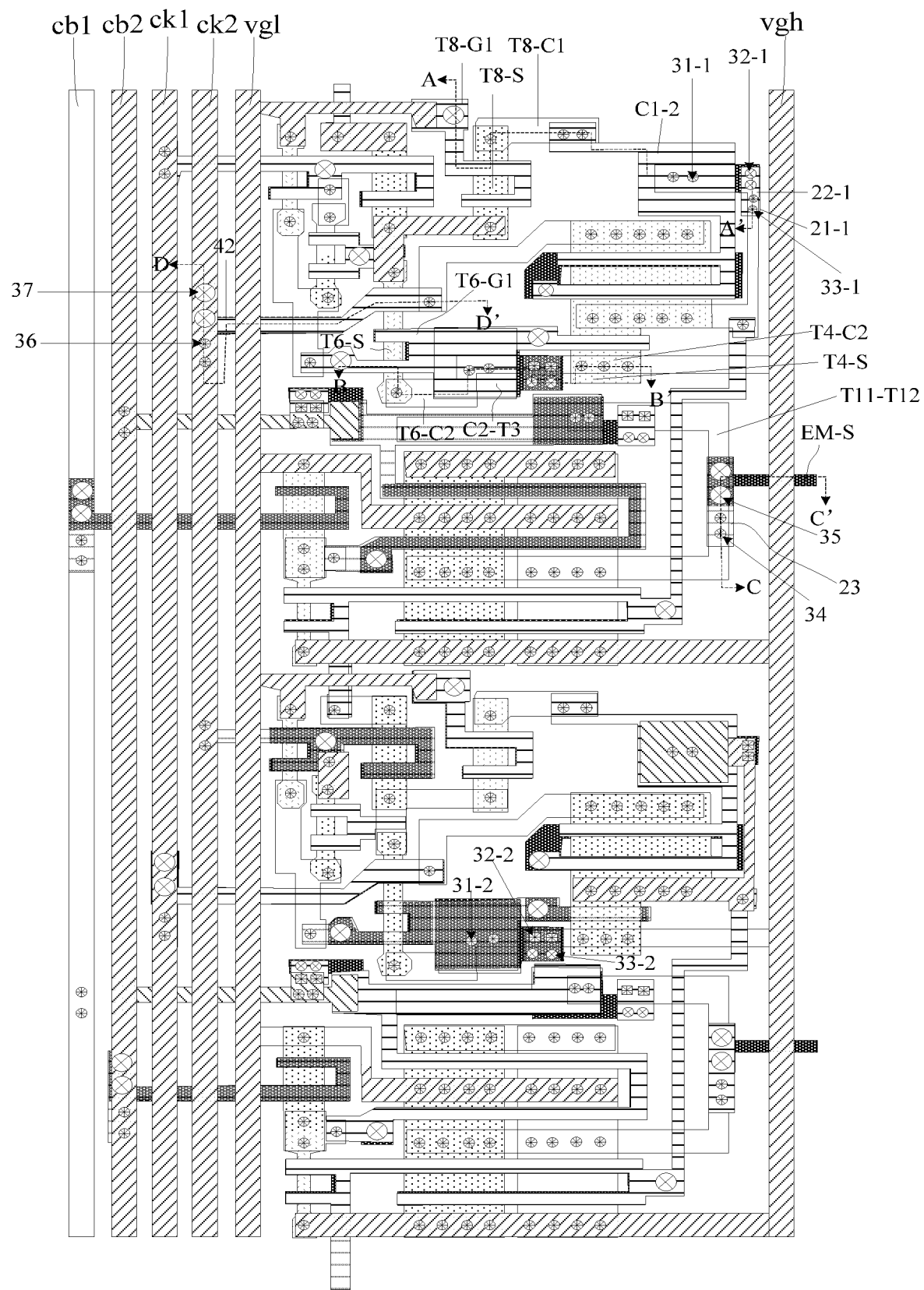
FIG. 3 is a schematic layout structural diagram of a light-emitting control circuit provided by an embodiment of the present disclosure.

During specific implementation, in the embodiment of the present disclosure, as shown in FIG. 1 to FIG. 3 in combination, the first signal driving line 11 may include: a first clock line ck1, a second clock line ck2, a first control line cb1, a second control line cb2, a first reference line vgl and a second reference line vgh. The first reference signal ends VGL of all the first shifting registers are electrically connected with the first reference line vgl, and the second reference signal ends VGH of all the first shifting registers are electrically connected with the second reference line vgh. And, the first clock signal ends CK1 of the first shifting registers of the odd stages and the second clock signal ends CK2 of the first shifting registers of the even stages are both electrically connected with the first clock line ck1, and the second clock signal end CK2 of the first shifting registers of the odd stages and the first clock signal ends CK1 of the first shifting registers of the even stages are both electrically connected with the second clock line ck2.

During specific implementation, in the embodiment of the present disclosure, at least one of the light-emitting control transistors T1-T12 may be double-gate transistor. Exemplarily, the light-emitting control transistors T1-T12 may be the double-gate transistors correspondingly. The light-emitting control transistors T1-T12 may include first bottom gates and first top gates which are electrically connected with each other. And, the first bottom gates are located at the first conducting layer 100, and the first top gates are located at the second conducting layer 200.

During specific implementation, the working process of the above light-emitting control circuit may be basically the same as that of the related art, which is omitted herein. It should be noted that in the embodiment of the present disclosure, in addition to the structure shown in FIG. 2, the light-emitting control circuit may be further of the structure including other numbers of transistors, which is not limited in the embodiment of the present disclosure.

Figure 4:
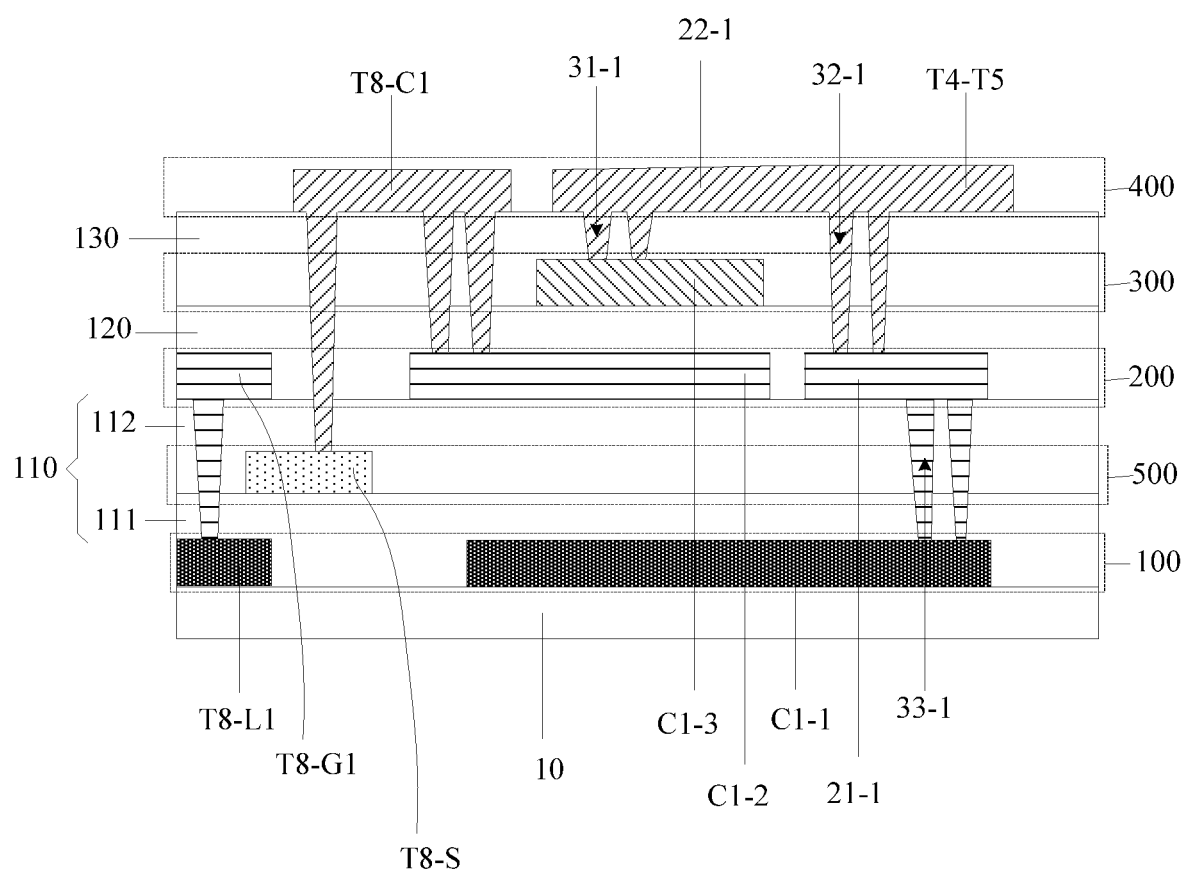
FIG. 4 is a schematic diagram of a cross-sectional structure in an AA' direction in the schematic layout structural diagram shown in FIG. 3.
Figure 5:
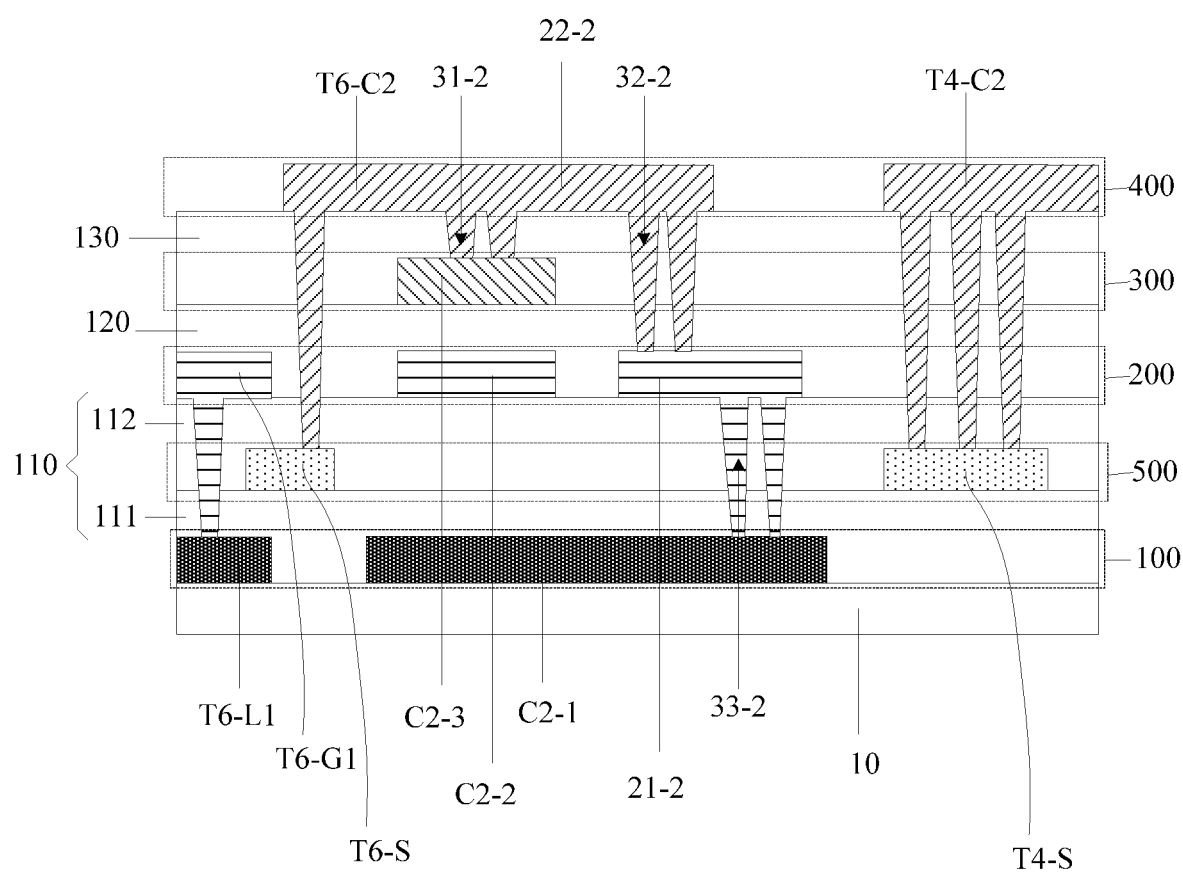
FIG. 5 is a schematic diagram of a cross-sectional structure in a BB' direction in the schematic layout structural diagram shown in FIG. 3.
Figure 6:
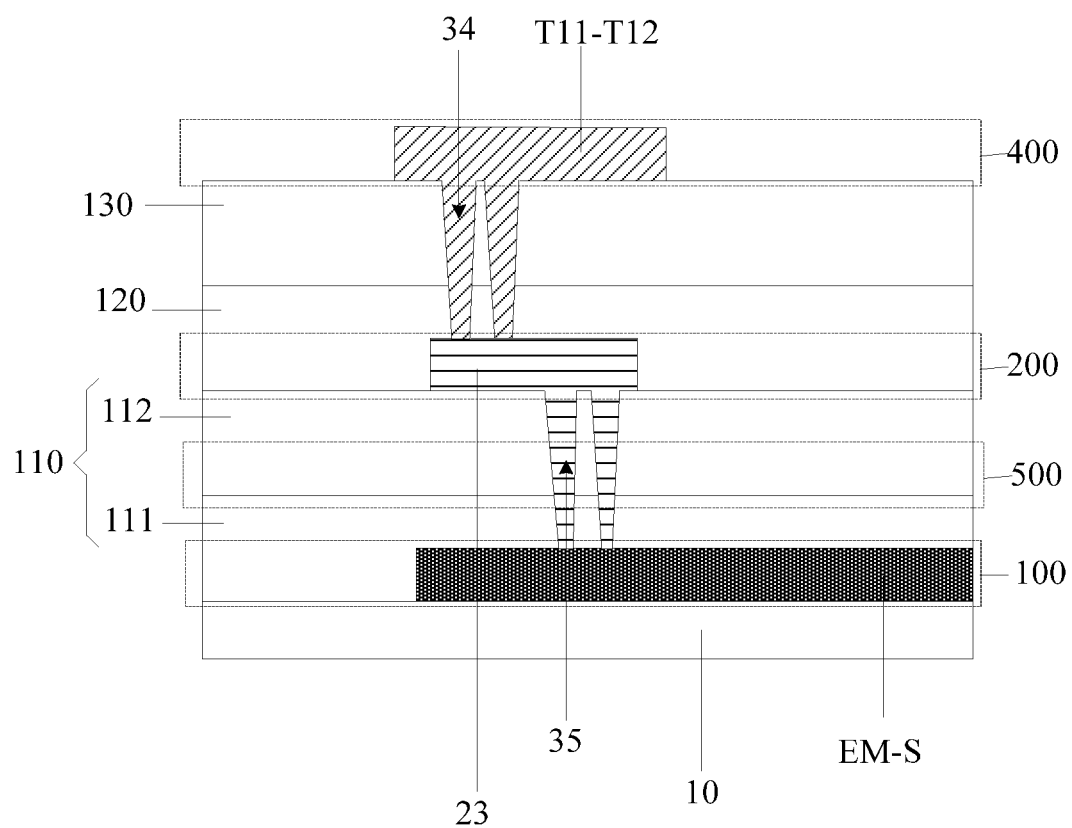
FIG. 6 is a schematic diagram of a cross-sectional structure in a CC' direction in the schematic layout structural diagram shown in FIG. 3.
Figure 7:
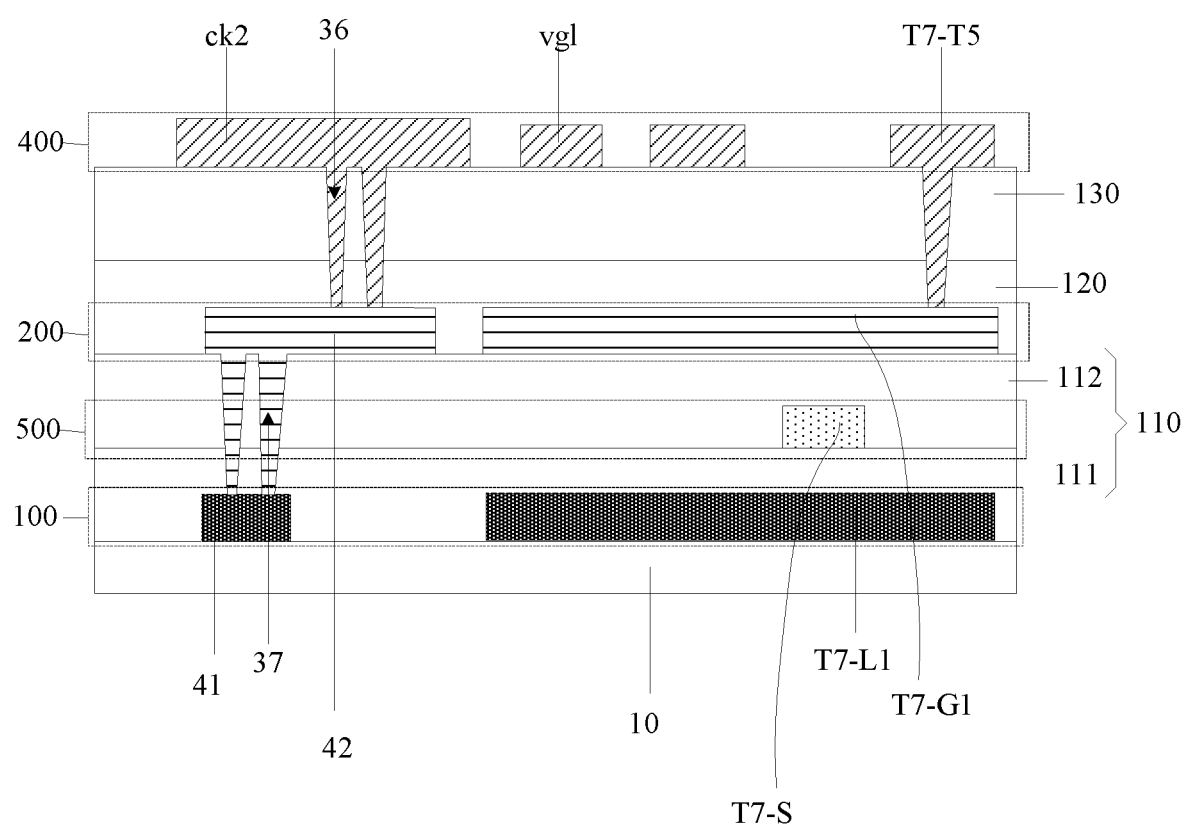
FIG. 7 is a schematic diagram of a cross-sectional structure in a DD' direction in the schematic layout structural diagram shown in FIG. 3.

FIG. 3 is a schematic layout diagram of the above light-emitting control circuit 14 on the base substrate 10. FIG. 4 is a schematic diagram of a cross-sectional structure in an AA' direction in the schematic layout diagram shown in FIG. 3. FIG. 5 is a schematic diagram of a cross-sectional structure in a BB' direction in the schematic layout diagram shown in FIG. 3. FIG. 6 is a schematic diagram of a cross-sectional structure in a CC' direction in the schematic layout diagram shown in FIG. 3. FIG. 7 is a schematic diagram of a cross-sectional structure in a DD' direction in the schematic layout diagram shown in FIG. 3. FIG. 3 to FIG. 7 are combined to show a schematic diagram of a stacked position relation of an active semiconductor layer 500, the first conducting layer 100, the second conducting layer 200, the third conducting layer 300 and a fourth conducting layer 400 in the above light-emitting control circuit 14. It should be noted that the display panel may further include: a buffer layer 111 located between the first conducting layer 100 and the active semiconductor layer 500, a gate insulating layer 112 located between the buffer layer 111 and the second conducting layer 200, a second insulating layer 120 located between the second conducting layer 200 and the third conducting layer 300, and a third insulating layer 130 located between the third conducting layer 300 and the fourth conducting layer 400.

During specific implementation, in the embodiment of the present disclosure, the storage capacitor may include at least one of the first capacitor C1, the second capacitor C2, the third capacitor C3 and the fourth capacitor C4. Exemplarily, the storage capacitor may include the first capacitor C1, the second capacitor C2, the third capacitor C3 and the fourth capacitor C4. In other words, each of the first capacitor C1, the second capacitor C2, the third capacitor C3 and the fourth capacitor C4 each may be formed in a sandwich capacitor mode. The situation that each of the first capacitor C1, the second capacitor C2, the third capacitor C3 and the fourth capacitor C4 each may be formed in the sandwich capacitor mode is taken as an example for explaining below.

During specific implementation, in the embodiment of the present disclosure, as shown in FIG. 3 to FIG. 7 in combination, the first conducting layer 100 may include: first bottom gates of the light-emitting control transistors T1-T12, a first electrode layer of the first capacitor C1, a first electrode layer of the second capacitor C2, a first electrode layer of the third capacitor C3 and a first electrode layer of the fourth capacitor C4. For example, FIG. 4 shows the first bottom gate T8-L1 of the light-emitting control transistor T8 and the first electrode layer C1-1 of the first capacitor C1. FIG. 5 shows the first bottom gate T6-L1 of the light-emitting control transistor T6 and the first electrode layer C2-1 of the second capacitor C2. FIG. 7 shows the first bottom gate T7-L1 of the light-emitting control transistor T7.

During specific implementation, in the embodiment of the present disclosure, as shown in FIG. 3 to FIG. 7 in combination, the active semiconductor layer 500 may be formed by a semiconductor material in a patterned mode. The active semiconductor layer 500 may be configured to make active layers of the above light-emitting control transistors T1-T12, and all the active layers may include source electrode regions, drain electrode regions and channel regions between the source electrode regions and the drain electrode regions. For example, the active layers of part of the transistors may be integrally arranged. Exemplarily, the active semiconductor layer 500 may be made of amorphous silicon, polycrystalline silicon and oxide semiconductor materials and the like. It should be noted that the above source electrode regions and drain electrode regions may be areas doped with n-type impurities or p-type impurities. For example, FIG. 4 shows the active layer T8-S of the light-emitting control transistor T8. FIG. 5 shows the active layer T4-S of the light-emitting control transistor T4 and the active layer T6-S of the light-emitting control transistor T6. FIG. 7 shows the active layer T7-S of the light-emitting control transistor T7.

During specific implementation, in the embodiment of the present disclosure, as shown in FIG. 3 to FIG. 7 in combination, the second conducting layer 200 may include: first top gates of the light-emitting control transistors T1-T12, a second electrode layer of the first capacitor C1, a second electrode layer of the second capacitor C2, a second electrode layer of the third capacitor C3 and a second electrode layer of the fourth capacitor C4. For example, FIG. 4 shows the first top gate T8-G1 of the light-emitting control transistor T8 and the second electrode layer C1-2 of the first capacitor C1. FIG. 5 shows the first top gate T6-G1 of the light-emitting control transistor T6 and the second electrode layer C2-2 of the second capacitor C2. FIG. 7 shows the first top gate T7-G1 of the light-emitting control transistor T7.

During specific implementation, in the embodiment of the present disclosure, as shown in FIG. 3 to FIG. 5 in combination, the third conducting layer 300 may include: a third electrode layer of the first capacitor C1, a third electrode layer of the second capacitor C2, a third electrode layer of the third capacitor C3 and a third electrode layer of the fourth capacitor C4. For example, FIG. 4 shows the third electrode layer C1-3 of the first capacitor C1. FIG. 5 shows the third electrode layer C2-3 of the second capacitor C2.

During specific implementation, in the embodiment of the present disclosure, as shown in FIG. 3 to FIG. 7 in combination, the fourth conducting layer 400 may include: the first signal driving line 11 (for example, the first clock line ck1, the second clock line ck2, the first control line cb1, the second control line cb2, the first reference line vgl and the second reference line vgh), and connecting parts for electric connection of the light-emitting control transistors T1-T12 and the first capacitor C1 to the fourth capacitor C4. For example, FIG. 4 shows the connecting part T8-C1 enabling the light-emitting control transistor T8 to be electrically connected with the first capacitor C1 and the connecting part T4-T5 enabling the light-emitting control transistor T4 to be electrically connected with the light-emitting control transistor T5. One end of the connecting part T8-C1 is electrically connected with the active layer of the light-emitting control transistor T8 through the via hole(s) penetrating through the gate insulating layer 112, the second insulating layer 120 and the third insulating layer 130. The other end of the connecting part T8-C1 is electrically connected with the second electrode layer C1-2 of the first capacitor C1 through the via hole(s) penetrating through the second insulating layer 120 and the third insulating layer 130.

FIG. 5 shows the connecting part T4-C2 enabling the light-emitting control transistor T4 to be electrically connected with the second capacitor C2 and the connecting part T6-C2 enabling the light-emitting control transistor T6 to be electrically connected with the second capacitor C2. One end of the connecting part T4-C2 is electrically connected with the active layer T4-S of the light-emitting control transistor T4 through the via hole(s) penetrating through the gate insulating layer 112, the second insulating layer 120 and the third insulating layer 130. The connecting part T6-C2 is electrically connected with the active layer T6-S of the light-emitting control transistor T6 through the via hole(s) penetrating through the gate insulating layer 112, the second insulating layer 120 and the third insulating layer 130.

During specific implementation, in the embodiment of the present disclosure, as shown in FIG. 3 to FIG. 7 in combination, the second conducting layer 200 may further include: a first connecting lead insulated from the second electrode layer. The fourth conducting layer 400 may further include a second connecting lead. One end of the second connecting lead is electrically connected with the third electrode layer through the first via hole(s) penetrating through the third insulating layer 130, the other end of the second connecting lead is electrically connected with the first connecting lead through the second via hole(s) penetrating through the second insulating layer 120 and the third insulating layer 130, and the first connecting lead is electrically connected with the first electrode layer through the third via hole(s) penetrating through the first insulating layer 110, so that the first electrode layer and the third electrode layer are electrically connected through the first connecting lead and the second connecting lead.

Further, during specific implementation, at least two first via holes may be formed. In this way, the second connecting lead may be electrically connected with the third electrode layer through the plurality of first via holes, and thus in the case that the second connecting lead cannot be electrically connected with the third electrode layer through part of the first via holes, the second connecting lead may be further electrically connected with the third electrode layer through the rest of the first via holes. Exemplarily, two first via holes may be formed. Of course, the plurality of first via holes may be further formed, which is not limited herein.

Further, during specific implementation, at least two second via holes may be formed. In this way, the second connecting lead may be electrically connected with the first connecting lead through the plurality of second via holes, and thus in the case that the second connecting lead cannot be electrically connected with the first connecting lead through part of the second via holes, the second connecting lead may be further electrically connected with the first connecting lead through the rest of the second via holes. Exemplarily, the two second via holes may be formed. Of course, the plurality of second via holes may be further formed, which is not limited herein.

Further, during specific implementation, at least two third via holes may be formed. In this way, the first connecting lead may be electrically connected with the first electrode layer through the plurality of third via holes, and thus in the case that the first connecting lead cannot be electrically connected with the first electrode layer through part of the third via holes, the first connecting lead may be further electrically connected with the first electrode layer through the rest of the third via holes. Exemplarily, the two third via holes may be formed. Of course, the plurality of third via holes may be further formed, which is not limited herein.

Exemplarily, as shown in FIG. 4, as for the first capacitor C1, an orthographic projection of the first electrode layer C1-1 on the base substrate 10, an orthographic projection of the second electrode layer C1-2 on the base substrate 10 and an orthographic projection of the third electrode layer C1-3 on the base substrate 10 have an overlap region with one another. One end of the second connecting lead 22-2 is electrically connected with the third electrode layer C1-3b through the two first via holes 31-1 penetrating through the third insulating layer 130, the other end of the second connecting lead 22-2 is electrically connected with the first connecting lead 21-1 through the two second via holes 32-1 penetrating through the second insulating layer 120 and the third insulating layer 130, and the first connecting lead 21-1 is electrically connected with the first electrode layer C1-1 through the two third via holes 33-1 penetrating through the first insulating layer 110, so that the first electrode layer C1-1 and the third electrode layer C1-3 are electrically connected with each other through the first connecting lead 21-1 and the second connecting lead 22-2 so as to form the first electrode of the first capacitor C1, so that the first capacitor C1 is formed in a sandwich capacitor mode. It should be noted that the second connecting lead 22-2 and the connecting part T4-T5 may be arranged into an integrated structure. Of course, the present disclosure includes but is not limited to this.

Exemplarily, as shown in FIG. 5, as for the second capacitor C2, an orthographic projection of the first electrode layer C2-1 on the base substrate 10, an orthographic projection of the second electrode layer C2-2 on the base substrate 10 and an orthographic projection of the third electrode layer C2-3 on the base substrate 10 have an overlap region with one another. One end of the second connecting lead 22-2 is electrically connected with the third electrode layer C2-3 through the two first via holes 31-2 penetrating through the third insulating layer 130, the other end of the second connecting lead 22-2 is electrically connected with the first connecting lead 21-2 through the two second via holes 32-2 penetrating through the second insulating layer 120 and the third insulating layer 130, and the first connecting lead 21-2 is electrically connected with the first electrode layer C2-1 through the two third via holes 33-2 penetrating through the first insulating layer 110, so that the first electrode layer C2-1 and the third electrode layer C2-3 are electrically connected through the first connecting lead 21-2 and the second connecting lead 22-2 so as to form the first electrode of the first capacitor C2, so that the second capacitor C2 is formed in a sandwich capacitor mode. It should be noted that the second connecting lead 22-2 and the connecting part T6-C2 may be arranged into an integrated structure. Of course, the present disclosure includes but is not limited to this.

Exemplarily, as for the third capacitor C3 and the fourth capacitor C4, their implementations may be set by referring to the above implementation, which is omitted herein.

Further, during specific implementation, an orthographic projection of the second via holes on the base substrate 10 and an orthographic projection of the third via holes on the base substrate 10 may be not overlapped with each other. Exemplarily, as shown in FIG. 3 and FIG. 4, the orthographic projection of the second via hole 32-1 on the base substrate 10 and the orthographic projection of the third via hole 33-1 on the base substrate 10 are not overlapped with each other. As shown in FIG. 3 and FIG. 5, the orthographic projection of the second via hole 32-2 on the base substrate 10 and the orthographic projection of the third via hole 33-2 on the base substrate 10 are not overlapped with each other. In this way, the problem of failure of normal electric connection caused by too deep via holes may be avoided.

During specific implementation, in the embodiment of the present disclosure, as shown in FIG. 3 and FIG. 6, the display panel may further include: a plurality of light-emitting control signal transmission lines EM-S located in the non-display area BB. One light-emitting control signal transmission line EM-S is electrically connected with one corresponding light-emitting control signal line, and a first signal output end GO of the light-emitting control circuit 14 is electrically connected with all the light-emitting control signal transmission lines EM-S. The light-emitting control signal transmission lines EM-S are located on the first conducting layer 100. Exemplarily, the second poles of the light-emitting control transistors T11 and T12 are electrically connected with the connecting part T11-T12 to serve as the first signal output end GO. And, the connecting part T11-T12 is electrically connected with the light-emitting control signal transmission lines EM-S located on the first conducting layer 100 to output light-emitting control signals to the light-emitting control signal lines through the light-emitting control signal transmission lines EM-S.

During specific implementation, in the embodiment of the present disclosure, as shown in FIG. 3 and FIG. 6, the second conducting layer 200 includes third connecting lead 23, output end of the light-emitting control transistor is electrically connected with the third connecting lead 23 through the fourth via hole(s) 34 penetrating through the second insulating layer 120 and the third insulating layer 130, and the third connecting lead 23 is electrically connected with the light-emitting control signal transmission line EM-S through the fifth via hole(s) 35 penetrating through a buffer layer 111 and a gate insulating layer 112, so that the light-emitting control signal transmission line EM-S is electrically connected with the output end of the light-emitting control transistor through the third connecting lead 23. Exemplarily, mutually-connected second poles of the light-emitting control transistors T11 and T12 may serve as the output end of the above light-emitting control transistor. In other words, the connecting part T11-T1 is electrically connected with the third connecting lead 23 through the fourth via hole(s) 34.

During specific implementation, in the embodiment of the present disclosure, as shown in FIG. 3 and FIG. 6, at least two fourth via holes 34 may be formed. In this way, the connecting part T11-T1 may be electrically connected with third connecting lead 23 through the plurality of fourth via holes 34, and thus in the case that the connecting part T11-T1 cannot be electrically connected with the third connecting lead 23 through part of the fourth via holes 34, the connecting part T11-T1 may be further electrically connected with the third connecting lead 23 through the rest of the fourth via holes 34. Exemplarily, the two fourth via holes 34 may be formed. Of course, the plurality of fourth via holes 34 may be further formed, which is not limited herein.

During specific implementation, in the embodiment of the present disclosure, as shown in FIG. 3 and FIG. 6, at least two fifth via holes 35 may be formed. In this way, the third connecting lead 23 may be electrically connected with the light-emitting control signal transmission line EM-S through the plurality of fifth via holes 35, and thus in the case that the third connecting lead 23 cannot be electrically connected with the light-emitting control signal transmission line EM-S through part of the fifth via holes 35, the third connecting lead 23 may be further electrically connected with the light-emitting control signal transmission line EM-S through the rest of the fifth via holes 35. Exemplarily, the two fifth via holes 35 may be formed. Of course, the plurality of fifth via holes 35 may be further formed, which is not limited herein.

During specific implementation, in the embodiment of the present disclosure, as shown in FIG. 3 and FIG. 6, an orthographic projection of the fourth via holes 34 on the base substrate 10 and an orthographic projection of the fifth via holes 35 on the base substrate 10 are not overlapped with each other. In this way, the problem of failure of normal electric connection caused by too deep via holes may be avoided.

During specific implementation, in the embodiment of the present disclosure, as shown in FIG. 3 and FIG. 7, the display panel may further include: a first transmission line in the non-display area BB. The first transmission line is electrically connected with the light-emitting control circuit 14. The first transmission line includes a first sub-transmission line 41 and a second sub-transmission line 42. The first sub-transmission line 41 is located on the first conducting layer 100, and the second sub-transmission line 42 is located on the second conducting layer 200. The first signal driving line 11 is electrically connected with the second sub-transmission line 42 through sixth the via hole(s) 36 penetrating through the second insulating later 120 and the third insulating layer 130, and the second sub-transmission line 42 is electrically connected with the first sub-transmission line 41 through the seventh via hole(s) 37 penetrating through the first insulating layer 110, so that the first signal driving line 11 and the light-emitting control circuit 14 are electrically connected through the first sub-transmission line 41 and the second sub-transmission line 42.

During specific implementation, in the embodiment of the present disclosure, at least two sixth via holes 36 may be formed. In this way, the first signal driving line 11 may be electrically connected with the second sub-transmission line 42 through the plurality of sixth via holes 36, and thus in the case that the first signal driving line 11 cannot be electrically connected with the second sub-transmission line 42 through part of the sixth via holes 36, the first signal driving line 11 may be further electrically connected with the second sub-transmission line 42 through the rest of the sixth via holes 36. Exemplarily, the two sixth via holes 36 may be formed. Of course, the plurality of sixth via holes 36 may be further formed, which is not limited herein.

During specific implementation, in the embodiment of the present disclosure, at least two seventh via holes 37 may be formed. In this way, the second sub-transmission line 42 may be electrically connected with the first-sub-transmission line 41 through the plurality of seventh via holes 37, and thus in the case that the second sub-transmission line 42 cannot be electrically connected with the first sub-transmission line 41 through part of the seventh via holes 37, the second sub-transmission line 42 may be further electrically connected with the first sub-transmission line 41 through the rest of the seventh via holes 37. Exemplarily, the two seventh via holes 37 may be formed. Of course, the plurality of seventh via holes 37 may be further formed, which is not limited herein.

During specific implementation, in the embodiment of the present disclosure, an orthographic projection of the sixth via hole(s) 36 on the base substrate 10 and an orthographic projection of the seventh via hole(s) 37 on the base substrate 10 are not overlapped with each other. In this way, the problem of failure of normal electric connection caused by too deep via holes may be avoided.

Exemplarily, at least one of the first clock line ck1, the second clock line ck2, the first control line cb1, the second control line cb2, the first reference line vgl and the second reference line vgh is electrically connected with the light-emitting control circuit 14 in the mode of the first transmission line. For example, taking the second clock line ck2 as an example, as shown in FIG. 3 and FIG. 7, the first transmission line electrically connected with the second clock line ck2 includes the first sub-transmission line 41 and the second sub-transmission line 42, the second clock line ck2 is electrically connected with the second sub-transmission line 42 through the two sixth via holes 36, and the second sub-transmission line 42 is electrically connected with the first sub-transmission line 41 through the two seventh via holes 37, so that the second clock line ck2 is electrically connected with the first bottom gate T7-L1 and the first top gate T7-G1 of the light-emitting control transistor T7 in the light-emitting control circuit 14, the first top gate T7-G1 of the light-emitting control transistor T7 is further electrically connected with the first pole of the light-emitting control transistor T5 through the connecting part T7-75. Of course, the implementations of the first clock line ck1, the first control line cb1, the second control line cb2, the first reference line vgl and the second reference line vgh may refer to the implementation of the second clock line ck2, which is omitted herein.

During specific implementation, in the embodiment of the present disclosure, the driving circuit may be further arranged as the scanning driving circuit 13. In this way, the storage capacitor in the scanning driving circuit 13 may be arranged in the sandwich capacitor mode, so that the occupied region of the scanning driving circuit 13 is decreased.

During specific implementation, in the embodiment of the present disclosure, the scanning driving circuit 13 may include: a plurality of cascaded second shifting registers. A second input signal end IN2 of the second shifting register of the first-stage is electrically connected with a frame triggering signal end, and in the rest of the second shifting registers, the second input signal end IN2 of the second shifting register of the next-stage is electrically connected with the scanning signal output end SO of the second shifting register of the former-stage. Moreover, the scanning signal output end SO of each second shifting register is configured to output scanning signals.

Figure 8:
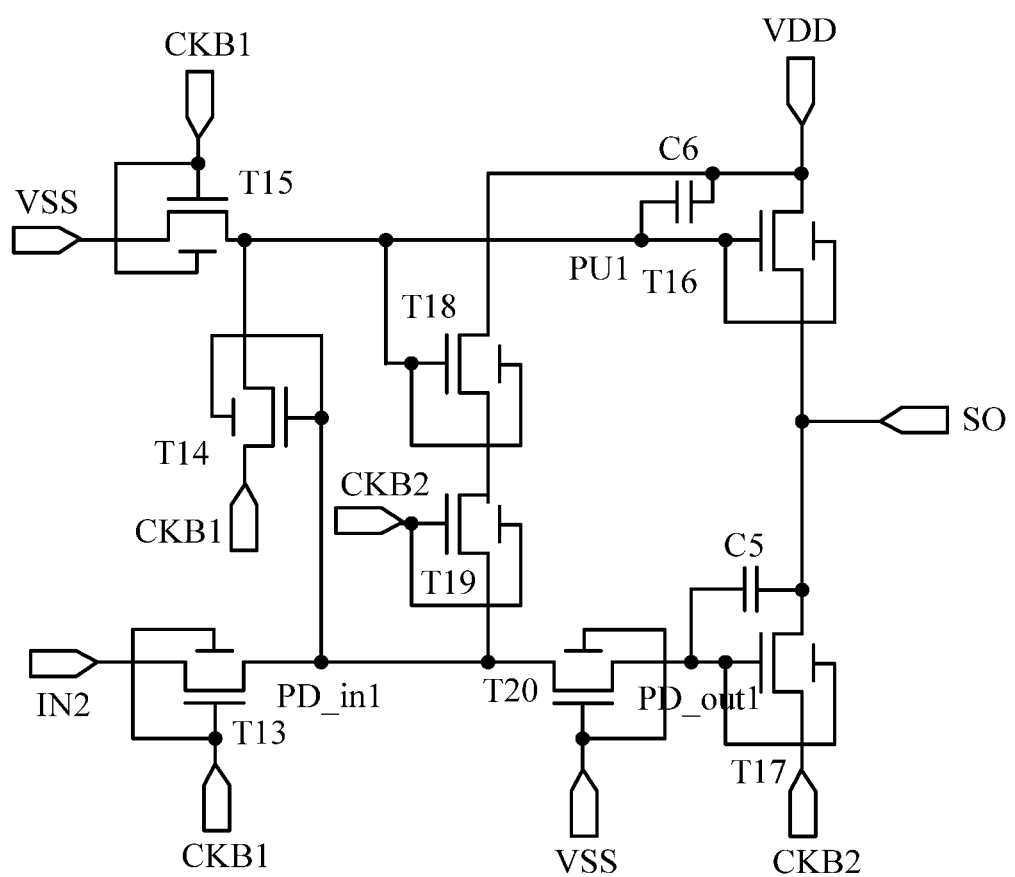
FIG. 8 is a schematic structural diagram of a scanning driving circuit provided by an embodiment of the present disclosure.

During specific implementation, in the embodiment of the present disclosure, as shown in FIG. 8, the second shifting register may include: a fifth capacitor C5, a sixth capacitor C6 and scanning driving transistors T13-T20. The gate of the scanning driving transistor T13 is electrically with the third clock signal end CKB1, the first pole of the scanning driving transistor T13 is electrically connected with the second input signal end IN2, and the second pole of the scanning driving transistor T13 is electrically connected with the sixth node PD_in1.

The gate of the scanning driving transistor T14 is electrically connected with the sixth node PD_in1, the first pole of the scanning driving transistor T14 is electrically connected with the third clock signal end CKB1, and the second pole of the scanning driving transistor T14 is electrically connected with seventh node PU1.

The gate of the scanning driving transistor T15 is electrically connected with the third clock signal end CKB1, the first pole of the scanning driving transistor T15 is electrically connected with third reference signal end VSS, and the second pole of the scanning driving transistor T15 is electrically connected with the seventh node PU1.

The gate of the scanning driving transistor T16 is electrically connected with the seventh node PU1, the first pole of the scanning driving transistor T16 is electrically connected with fourth reference signal end VDD, and the second pole of the scanning driving transistor T16 is electrically connected with the scanning signal output end SO.

The gate of the scanning driving transistor T17 is electrically connected with eighth node PD_out1, the first pole of the scanning driving transistor T17 is electrically connected with fourth clock signal end CKB2, and the second pole of the scanning driving transistor T17 is electrically connected with the scanning signal output end SO.

The gate of the scanning driving transistor T18 is electrically connected with the seventh node PU1, the first pole of the scanning driving transistor T18 is electrically connected with the fourth reference signal end VDD, and the second pole of the scanning driving transistor T18 is electrically connected with the first pole of the scanning driving transistor T19.

The gate of the scanning driving transistor T19 is electrically connected with the fourth clock signal end CKB2, and the second pole of the scanning driving transistor T19 is electrically connected with the sixth node PD_in1.

The gate of the scanning driving transistor T20 is electrically connected with the third reference signal end VSS, the first pole of the scanning driving transistor T20 is electrically connected with the sixth node PD_in1, and the second pole of the scanning driving transistor T20 is electrically connected with eighth node PD_out1.

The first electrode of the fifth capacitor C5 is electrically connected with the scanning signal output end SO, and the second electrode of the fifth capacitor C5 is electrically connected with the gate of the scanning driving transistor T17.

The first electrode of the sixth capacitor C6 is electrically connected with the fourth reference signal end VDD, and the second electrode of the sixth capacitor C6 is electrically connected with the gate of the scanning driving transistor T16.

Figure 9:
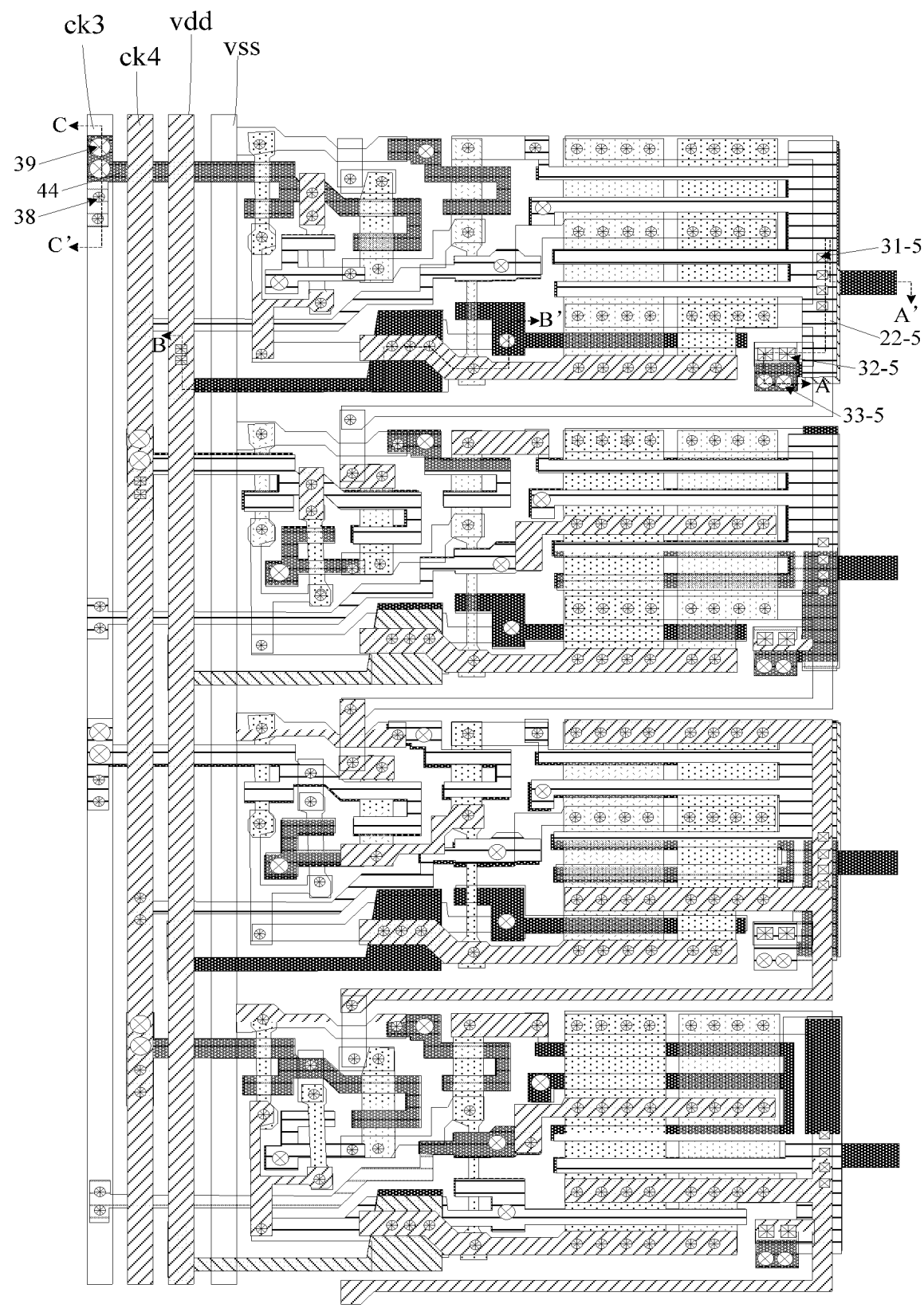
FIG. 9 is a schematic layout structural diagram of a scanning driving circuit provided by an embodiment of the present disclosure.

During specific implementation, in the embodiment of the present disclosure, as shown in FIG. 1, FIG. 8 and FIG. 9 in combination, the second signal driving line 12 may include: a third clock line ck3, a fourth clock line ck4, a third reference line vss and a fourth reference line vdd. The third reference signal ends VSS of all the second shifting registers are electrically connected with the third reference line vss. The fourth reference signal ends VDD of all the second shifting registers are electrically connected with the fourth reference line vdd. The third clock signal ends CKB1 of the second shifting registers of the odd stages and the fourth clock signal ends CKB2 of the second shifting registers of the even stages are both electrically connected with the third clock line ck3, and the second clock signal ends CKB2 of the second shifting registers of the odd stages and the first clock signal ends CKB1 of the second shifting registers of the even stages are both electrically connected with the fourth clock line ck4.

During specific implementation, in the embodiment of the present disclosure, at least one of the scanning driving transistors T13-T20 may be a double-gate transistor. Exemplarily, each of the scanning driving transistors T13-T20 may be the double-gate transistor. The scanning driving transistors T13-T20 may include second bottom gates and second top gates which are electrically connected to each other. The second bottom gates are located at the first conducting layer 100, and the second top gates are located at the second conducting layer 200.

During specific implementation, the working process of the above scanning driving circuit 13 may be the same as that of the related art, which is omitted herein. It should be noted that in the embodiment of the present disclosure, in addition to the structure shown in FIG. 13, the scanning driving circuit 13 may be further of the structure including other numbers of transistors, which is not limited by the embodiment of the present disclosure.

Figure 10:
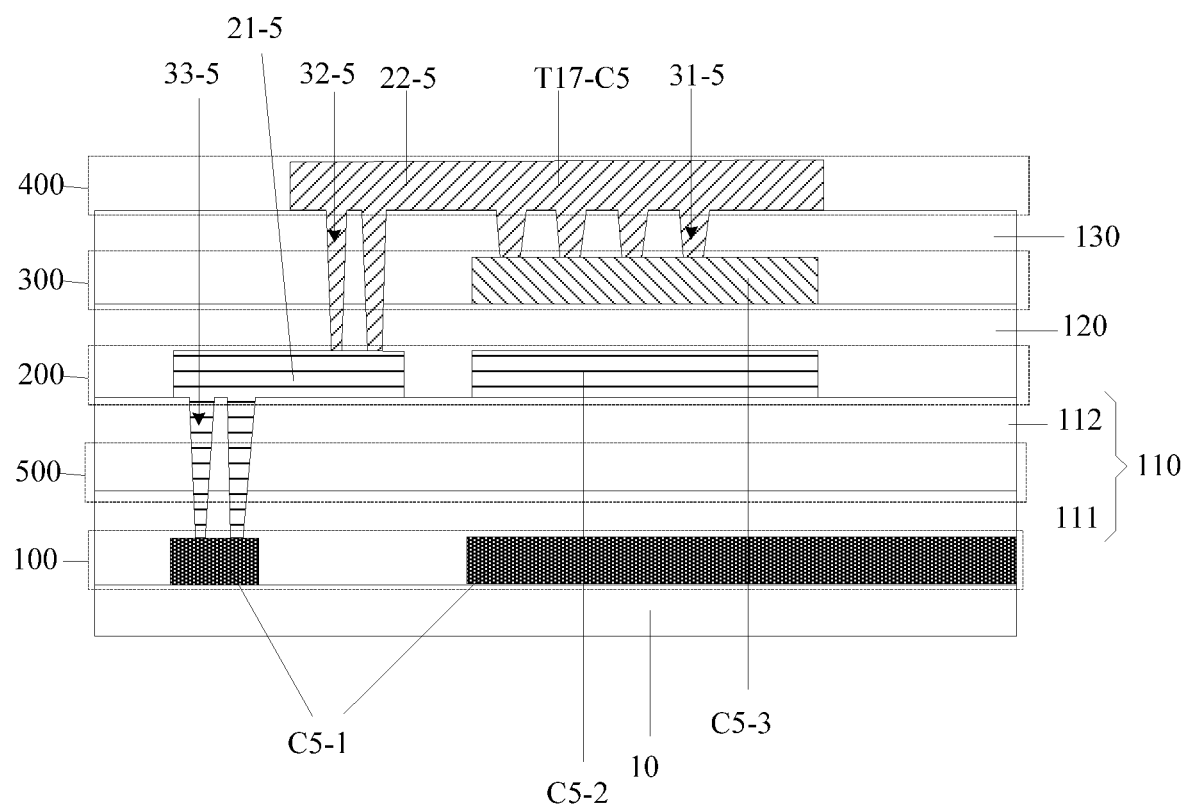
FIG. 10 is a schematic diagram of a cross-sectional structure in an AA' direction in the schematic layout structural diagram shown in FIG. 9.
Figure 11:
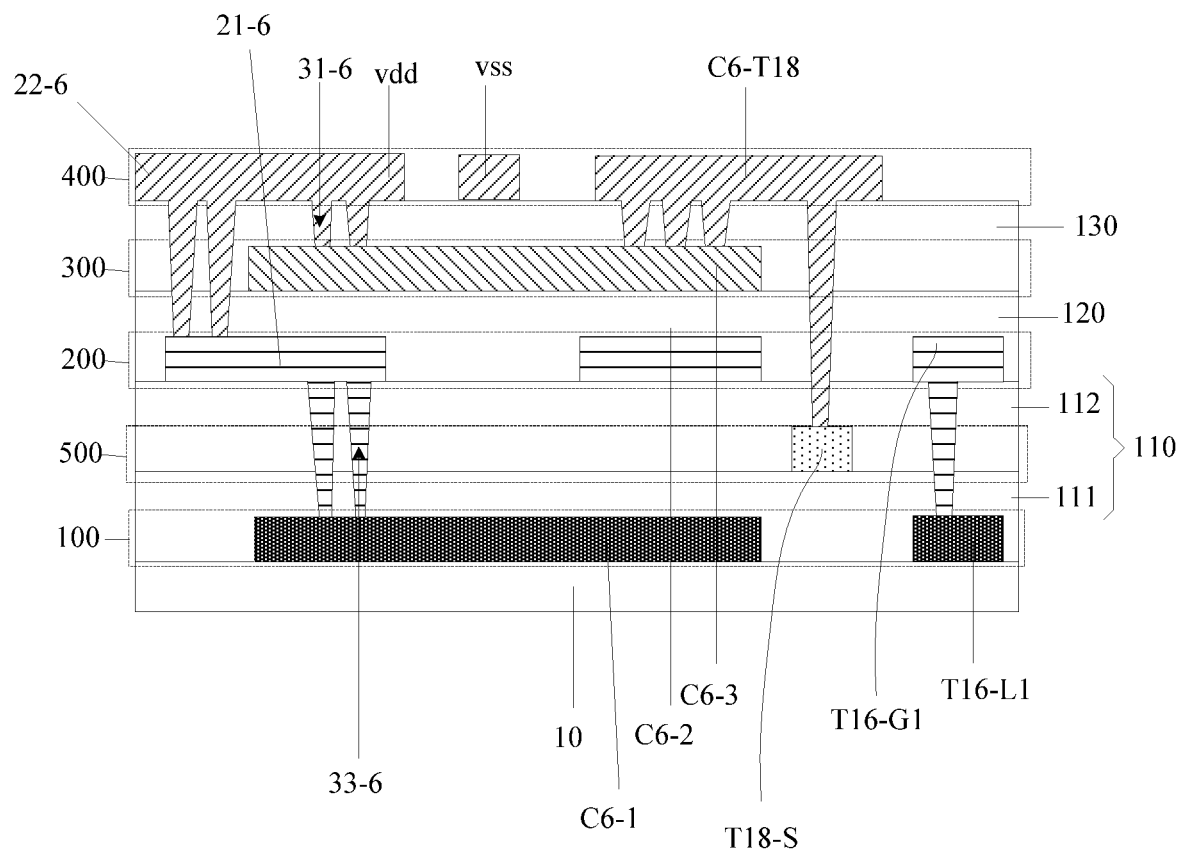
FIG. 11 is a schematic diagram of a cross-sectional structure in a BB' direction in the schematic layout structural diagram shown in FIG. 9.
Figure 12:
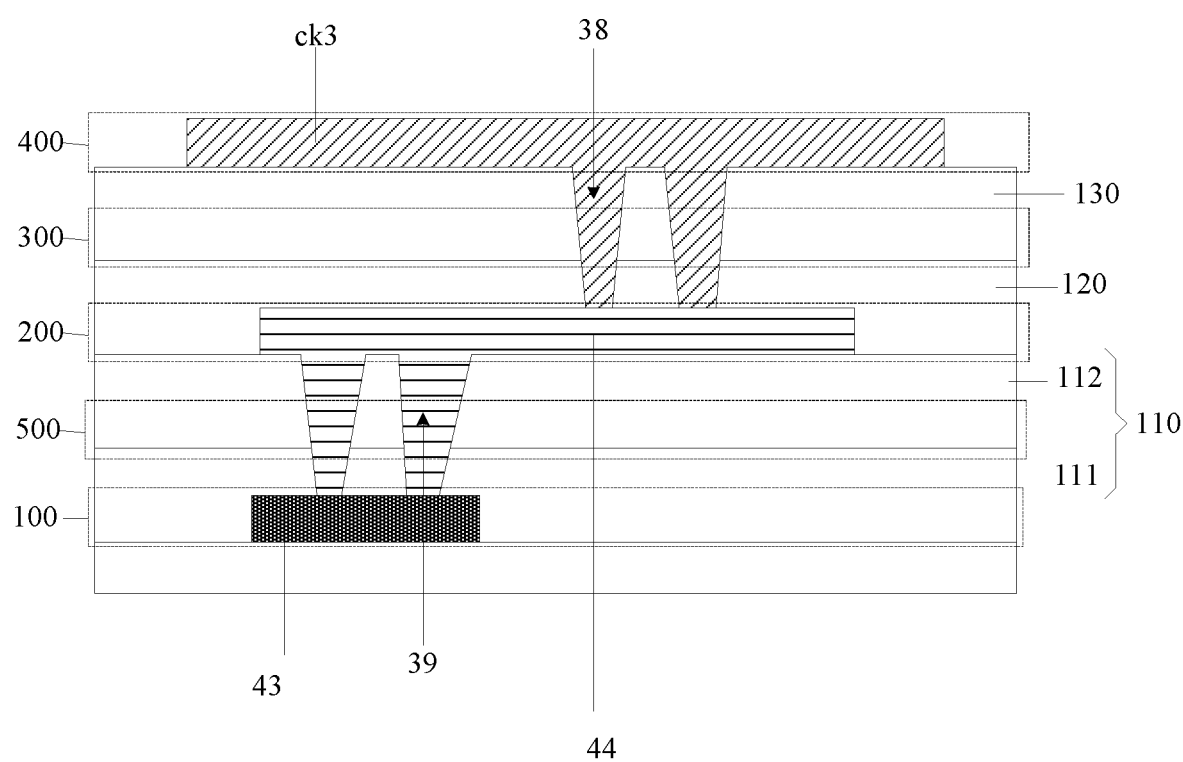
FIG. 12 is a schematic diagram of a cross-sectional structure in a CC' direction in the schematic layout structural diagram shown in FIG. 9.

FIG. 9 is a schematic layout diagram of the scanning driving circuit 13 on the base substrate 10. FIG. 10 is a schematic diagram of a cross-sectional structure in the AN direction in the schematic layout diagram shown in FIG. 9. FIG. 11 is a schematic diagram of a cross-sectional structure in the BB' direction in the schematic layout diagram shown in FIG. 9. FIG. 12 is a schematic diagram of a cross-sectional structure in the CC' direction in the schematic layout diagram shown in FIG. 9. An active semiconductor layer 500, a first conducting layer 100, a second conducting layer 200, a third conducting layer 300 and a fourth conducting layer 400 of the scanning driving circuit 13 and the active semiconductor layer 500, the first conducting layer 100, the second conducting layer 200, the third conducting layer 300 and the fourth conducting layer 400 of the light-emitting control circuit 14 are arranged on the same layer and made of the same materials, which is not described in detail herein.

During specific implementation, in the embodiment of the present disclosure, the storage capacitor may include at least one of the fifth capacitor C5 and the sixth capacitor C6. Exemplarily, the storage capacitor may include the fifth capacitor C5 and the sixth capacitor C6. In other words, both the fifth capacitor C5 and the sixth capacitor C6 may be formed in the sandwich capacitor mode. The situation that each of the fifth capacitor C5 and the sixth capacitor C6 may be formed in the sandwich capacitor mode is taken as an example for explaining below.

During specific implementation, in the embodiment of the present disclosure, as shown in FIG. 9 to FIG. 11 in combination, the first conducting layer 100 may further include: second bottom gates of the scanning driving transistors T13-T20, the first electrode layer of the fifth capacitor C5 and the first electrode layer of the sixth capacitor C6. For example, FIG. 10 shows the first electrode layer C5-1 of the fifth capacitor C5. FIG. 11 shows the first electrode layer C6-1 of the sixth capacitor C6 and a second bottom gate T16-L1 of the scanning driving transistor T16.

During specific implementation, in the embodiment of the present disclosure, as shown in FIG. 9 to FIG. 11 in combination, the active semiconductor layer 500 may be configured to make active layers of the scanning driving transistors T13-T20, and the active layers each may include the source electrode region, the drain electrode region and the channel region between the source electrode region and the drain electrode region. For example, the active layers of part of the transistors may be integrally arranged. It should be noted that the above source electrode region and drain electrode region may be regions doped with n-type impurities or p-type impurities. For example, FIG. 11 shows the active layer T18-S of the scanning driving transistor T18.

During specific implementation, in the embodiment of the present disclosure, as shown in FIG. 9 to FIG. 11 in combination, the second conducting layer 200 may further include: second top gates of the scanning driving transistors T13-T20, a second electrode layer of the fifth capacitor C5, a second electrode layer of the sixth capacitor C6 and the first connecting leads 21-5 and 21-6. For example, FIG. 10 shows the second electrode layer C5-2 and the first connecting lead 21-5 of the fifth capacitor C5. FIG. 11 shows the second electrode layer C6-2 and the first connecting lead 21-6 of the sixth capacitor C6, and the second top gate T16-G1 of the scanning driving transistor T16.

During specific implementation, in the embodiment of the present disclosure, as shown in FIG. 9 to FIG. 11 in combination, the third conducting layer 300 may further include: a third electrode layer of the fifth capacitor C5 and a third electrode layer of the sixth capacitor C6. For example, FIG. 10 shows the third electrode layer C5-3 of the fifth capacitor C5. FIG. 11 shows the third electrode layer C6-3 of the sixth capacitor C6.

During specific implementation, in the embodiment of the present disclosure, as shown in FIG. 9 to FIG. 11 in combination, the fourth conducting layer 400 may further include: a second signal driving line 12 (for example, the third clock line ck3, the fourth clock line ck4, the third reference line vss and/or the fourth reference line vdd), connecting parts configured to enable the scanning driving transistors T13-T20, the fifth capacitors C5 and the sixth capacitors C6 to be electrically connected, and second connecting leads 22-5 and 22-6. For example, FIG. 10 shows the second connecting lead 22-5 and the connecting part T17-C5 enabling the scanning driving transistor T17 to be electrically connected with the fifth capacitor C5. One end of the connecting part T17-C5 is electrically connected with the active layer of the scanning driving transistor T17 through the via holes penetrating through the gate insulating layer 112, the second insulating layer 120 and the third insulating layer 130. The second connecting lead 22-5 and the connecting part T17-C5 are of an integrated structure.

Exemplarily, as shown in FIG. 10, as for the fifth capacitor C5, an orthographic projection of the first electrode layer C5-1 on the base substrate 10, an orthographic projection of the second electrode layer C5-2 on the base substrate 10 and an orthographic projection of the third electrode layer C5-3 on the base substrate 10 have an overlap region with one another. One end of the second connecting lead 22-5 is electrically connected with the third electrode layer C5-3 through the four first via holes 31-5 penetrating through the third insulating layer 130, and the other end of the second connecting lead 22-5 is electrically connected with the first connecting lead 21-5 through the two second via holes 32-5 penetrating through the second insulating layer 120 and the third insulating layer 130, and the first connecting lead 21-5 is electrically connected with the first electrode layer C5-1 through the two third via holes 33-5 penetrating through the first insulating layer 110, so that the first electrode layer C5-1 and the third electrode layer C5-3 are electrically connected through the first connecting lead 21-5 and the second connecting lead 22-5 so as to form a first electrode of the fifth capacitor C5 to form the fifth capacitor C5 in the sandwich capacitor mode.

Exemplarily, as shown in FIG. 11, as for the sixth capacitor 6, an orthographic projection of the first electrode layer C6-1 on the base substrate 10, an orthographic projection of the second electrode layer C6-2 on the base substrate 10 and an orthographic projection of the third electrode layer C6-3 on the base substrate 10 have an overlap region with one another. One end of the second connecting lead 22-6 is electrically connected with the third electrode layer C6-3 through the two first via holes 31-6 penetrating through the third insulating layer 130, the other end of the second connecting lead 22-6 is electrically connected with the first connecting lead 21-6 through the two second via holes 32-6 penetrating through the second insulating layer 120 and the third insulating layer 130, and the first connecting lead 21-6 is electrically connected with the first electrode layer C6-1 through the two third via holes 33-6 penetrating through the first insulating layer 110, so that the first electrode layer C6-1 is electrically connected with the third electrode layer C6-3 through the first connecting lead 21-6 and the second connecting lead 22-6 so as to form a first electrode of the sixth capacitor C6 to form the sixth capacitor C6 in the sandwich capacitor mode.

Exemplarily, as shown in FIG. 9 and FIG. 10, an orthographic projection of the second via hole(s) 32-5 on the base substrate 10 and an orthographic projection of the third via hole(s) 33-5 on the base substrate 10 are not overlapped with each other. As shown in FIG. 9 and FIG. 11, an orthographic projection of the second via hole(s) 32-6 on the base substrate 10 and an orthographic projection of the third via hole(s) 33-6 on the base substrate 10 are not overlapped with each other. In this way, the problem of failure of normal electric connection caused by too deep via holes may be avoided.

During specific implementation, in the embodiment of the present disclosure, as shown in FIG. 9 and FIG. 12, the display panel may further include: a second transmission line located in the non-display area BB. The first transmission line is electrically connected with the scanning driving circuit 13. The second transmission line includes a third sub-transmission line 43 and a fourth sub-transmission line 44. The third sub-transmission line 43 is located at the first conducting layer 100, and the fourth sub-transmission line 44 is located at the second conducting layer 200. The second signal driving line 12 is electrically connected with the fourth sub-transmission line 44 through the eighth via hole(s) 38 penetrating through the second insulating layer 120 and the third insulating layer 130, and the fourth sub-transmission line 44 is electrically connected with the third sub-transmission line 43 through ninth via hole(s) 39 penetrating through the first insulating layer 110, so that the second signal driving line 12 is electrically connected with the scanning driving circuit 13 through the third sub-transmission line 43 and the fourth sub-transmission line 44.

During specific implementation, in the embodiment of the present disclosure, the at least two eighth via holes 38 may be formed. In this way, the second signal driving line 12 may be electrically connected with the fourth sub-transmission line 44 through the plurality of eighth via holes 38, and thus in the case that the second signal driving line 12 cannot be electrically connected with the fourth sub-transmission line 44 through part of the eighth via holes 38, the second signal driving line 12 may be further electrically connected with the fourth sub-transmission line 44 through the rest of the eighth via holes 38. Exemplarily, the two eighth via holes 38 may be formed. Of course, the plurality of eighth via holes 38 may be further formed, which is not limited herein.

During specific implementation, in the embodiment of the present disclosure, the at least two ninth via holes 39 may be formed. In this way, the fourth sub-transmission line 44 may be electrically connected with the third sub-transmission line 43 through the plurality of ninth via holes 39, and thus in the case that the fourth sub-transmission line 44 cannot be electrically connected with the third sub-transmission line 43 through part of the ninth via holes 39, the fourth sub-transmission line 44 may be further electrically connected with the third sub-transmission line 43 through the rest of the ninth via holes 39. Exemplarily, the two ninth via holes 39 may be formed. Of course, the plurality of ninth via holes 39 may be further formed, which is not limited herein.

During specific implementation, in the embodiment of the present disclosure, an orthographic projection of the eighth via hole(s) 38 on the base substrate 10 and an orthographic projection of the ninth via hole(s) 39 on the base substrate 10 are not overlapped with each other. In this way, the problem of failure of normal electric connection caused by too deep via holes may be avoided.

Exemplarily, at least one of the third clock line ck3, the fourth clock line ck4, the third reference line vss and the fourth reference line vdd may be electrically connected with the scanning driving circuit 13 in the mode of the second transmission line. For example, taking the third clock line ck3 as an example, as shown in FIG. 9 and FIG. 12, the second transmission line electrically connected with the third clock line ck3 includes the third sub-transmission line 43 and the fourth sub-transmission line 44, the third clock line ck3 is electrically connected with the fourth sub-transmission line 44 through the two eighth via holes 38, and the fourth sub-transmission line 44 is electrically connected with the third sub-transmission line 43 through the two ninth via holes 39, so that the third clock line ck3 is electrically connected with the second bottom gate and the second top gate of the scanning driving transistor T15 in the scanning driving circuit 13. Of course, the implementations of the fourth clock line ck4, the third reference line vss and the fourth reference line may refers to the implementation of the above third clock line ck3, which is omitted herein.

During specific implementation, in the embodiment of the present disclosure, the driving circuit may be further arranged as a pixel circuit. In this way, the storage capacitor in the pixel circuit may be arranged in the sandwich capacitor mode, so that the occupied region of the pixel circuit is decreased.

Figure 13:
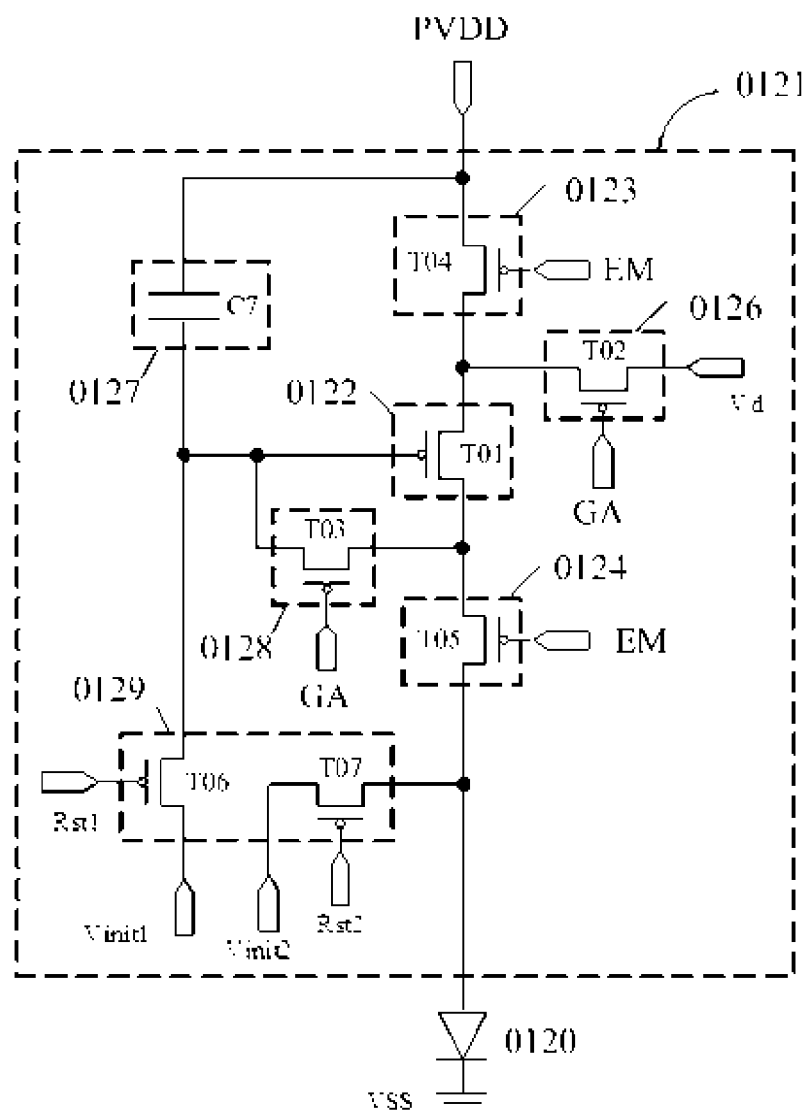
FIG. 13 is a schematic structural diagram of a pixel circuit provided by an embodiment of the present disclosure.

As shown in FIG. 13, the pixel circuit may include: a pixel driving circuit 0122, a first light-emitting control circuit 123, a second light-emitting control circuit 124, a data write circuit 0126, a storage circuit 0127, a threshold compensation circuit 0128 and a reset circuit 0129. The pixel driving circuit 0122 includes a control end, a first end and a second end and is configured to provide a driving current for a light-emitting element 0120 to drive the light-emitting element 0120 to emit light. For example, the first light-emitting control circuit 123 is connected with the first end of the pixel driving circuit 0122 and a first power source end PVDD and configured to realize connection or disconnection of the pixel driving circuit 0122 and the first power source end PVDD, the second light-emitting control circuit 124 is electrically connected with the second end of the pixel driving circuit 0122 and a first light-emitting voltage application electrode of the light-emitting element 0120 and configured to realize connection or disconnection of the pixel driving circuit 0122 and the light-emitting element 0120. The data write circuit 0126 is electrically connected with the first end of the pixel driving circuit 0122 and configured to write a data signal into the storage circuit 0127 under control of a scanning signal. The storage circuit 0127 is electrically connected with the control end of the pixel driving circuit 0122 and the first power source end PVDD and configured to store the data signal. The threshold compensation circuit 0128 is electrically connected with the control end and the second end of the pixel driving circuit 0122 and configured to carry out threshold compensation on the pixel driving circuit 0122. The reset circuit 0129 is electrically connected with the control end of the pixel driving circuit 0122 and the first light-emitting voltage application electrode of the light-emitting element 0120 and configured to reset the control end of the pixel driving circuit 0122 and the first light-emitting voltage application electrode of the light-emitting element 0120 under control of a reset control signal.

Exemplarily, as shown in FIG. 13 in combination, the pixel driving circuit 0122 includes: a driving transistor T01. The control end of the pixel driving circuit 0122 includes a gate of the driving transistor T01. The first end of the pixel driving circuit 0122 includes a first pole of the driving transistor T01. The second end of the pixel driving circuit 0122 includes a second pole of the driving transistor T01.

Exemplarily, as shown in FIG. 13 in combination, the data write circuit 0126 includes a data write transistor T02. The storage circuit 0127 includes a seventh capacitor C7. The threshold compensation circuit 0128 includes a threshold compensation transistor T03. The first light-emitting control circuit 123 includes a first light-emitting control transistor T04. The second light-emitting control circuit 124 includes a second light-emitting control transistor T05. The reset circuit 0129 includes a first reset transistor T06 and a second reset transistor T07. The reset control signal may include a first sub-reset control signal and a second sub-reset control signal.

Specifically, a first pole of the data write transistor T02 is electrically connected with the first pole of the driving transistor T01. A second pole of the data write transistor T02 is configured to be electrically connected with a data line Vd to receive the data signal. A gate of the data write transistor T02 is configured to be electrically connected with a gate line GA to receive the scanning signal. A first pole of the seventh capacitor C7 is electrically connected with the first power source end PVDD, and a second pole of the seventh capacitor C7 is electrically connected with the gate of the driving transistor T01. A first pole of the threshold compensation transistor T03 is electrically connected with the second pole of the driving transistor T01, and a second pole of the threshold compensation transistor T03 is electrically connected with the gate of the driving transistor T01. A gate of the threshold compensation transistor T03 is configured to be electrically connected with the gate line GA to receive the scanning signal. A first pole of the first reset transistor T06 is configured to be electrically connected with a first reset power source end Vinit1 to receive a first reset signal. A second pole of the first reset transistor T06 is electrically connected with the gate of the driving transistor T01. A gate of the first reset transistor T06 is configured to be electrically connected with a first reset control signal line Rst1 to receive the first sub-reset control signal. A first pole of the second reset transistor T07 is configured to be electrically connected with a second reset power source end Vinit2 to receive a second reset signal. A second pole of the second reset transistor T07 is electrically connected with the first light-emitting voltage application electrode of the light-emitting element 0120, a gate of the second reset transistor T07 is configured to be electrically connected with a second reset control signal line Rst2 to receive the second sub-reset control signal. A first pole of the first light-emitting control transistor T04 is electrically connected with the first power source end PVDD. A second pole of the first light-emitting control transistor T04 is electrically connected with the first pole of the driving transistor T01. A gate of the first light-emitting control transistor T04 is configured to be electrically connected with a light-emitting control signal line EM to receive a light-emitting control signal. A first pole of the second light-emitting control transistor T05 is electrically connected with the second pole of the driving transistor T01. A second pole of the second light-emitting control transistor T05 is electrically connected with the first light-emitting voltage application electrode of the light-emitting element 0120. A gate of the second light-emitting control transistor T05 is configured to be electrically connected with the light-emitting control signal line EM to receive the light-emitting control signal. A second light-emitting voltage application electrode of the light-emitting element 0120 is electrically connected with a second power source end VSS. The first poles and the second poles may be determined as source electrodes or drain electrodes according to practical application, which is not limited herein.

Exemplarily, one of the first power source end PVDD and the second power source end VSS is a high-voltage end, and the other one is a low-voltage end. For example, in the embodiment shown in FIG. 13, the first power source end PVDD serves as a voltage source to output a constant first voltage, and the first voltage is a positive voltage. The second power source end VSS may serves as a voltage source to output a constant second voltage, and the second voltage is a negative voltage. For example, in certain examples, the second power source end VSS may be connected to the ground.

It should be noted that in the embodiment of the present disclosure, the pixel circuit in the sub-pixels spx may further include the structure including other numbers of transistors in addition to the structure shown in FIG. 13, which is not limited by the embodiment of the present disclosure.

During specific implementation, in the embodiment of the present disclosure, the storage capacitor may include the seventh capacitors. In other words, each of the seventh capacitors may be formed in the sandwich capacitor mode. It should be noted that the implementation for forming sandwich capacitors of the seventh capacitors C7 may refer to the implementation for forming the first capacitors C1 to the sixth capacitors C6, which is omitted herein.

Figure 14:
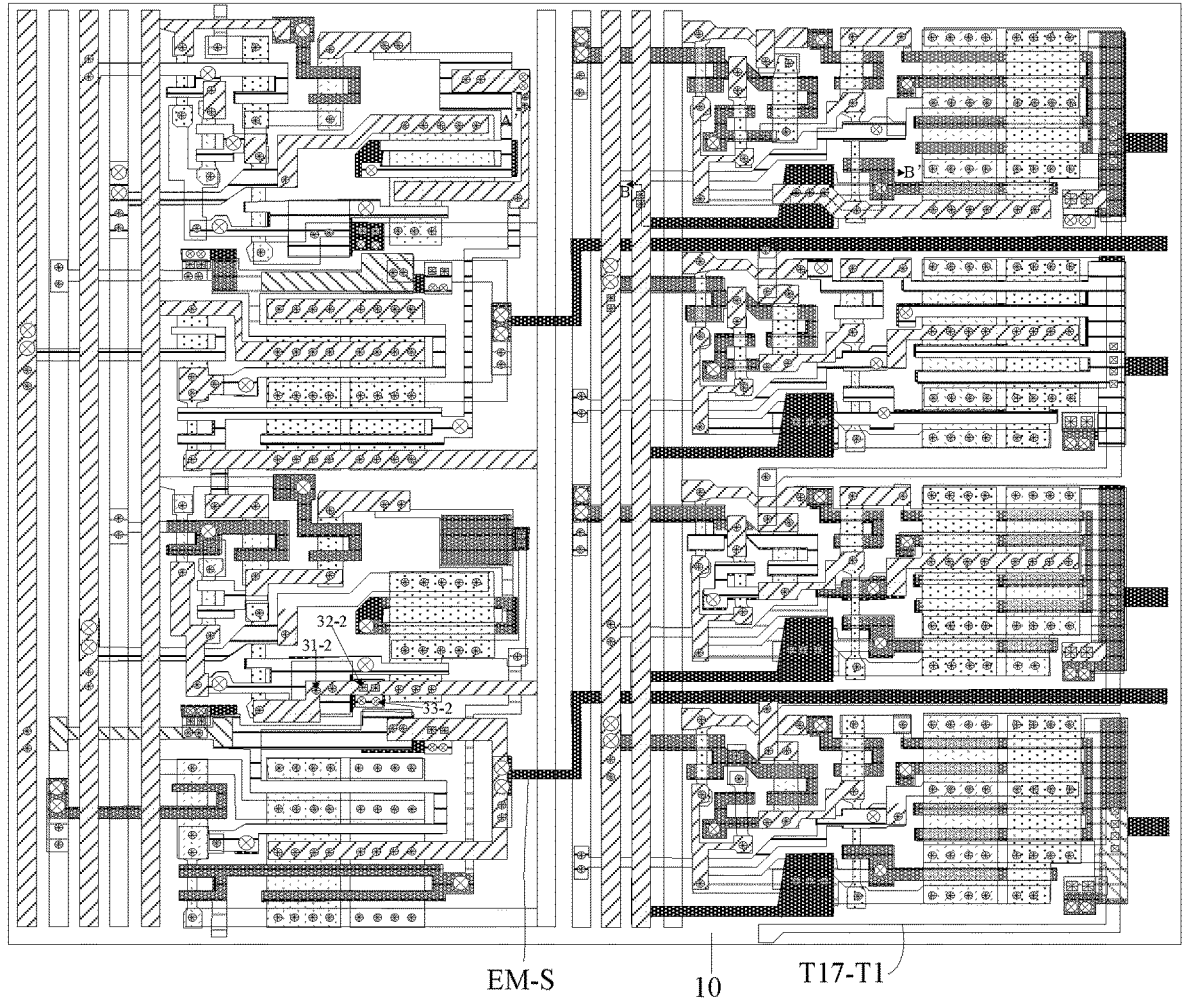
FIG. 14 is a schematic layout structural diagram of a light-emitting control circuit and a scanning driving circuit provided by an embodiment of the present disclosure.

Further, during specific implementation, in the embodiment of the present disclosure, as shown in FIG. 14, when the light-emitting control circuit 14 is located on the side, away from the display area AA, of the scanning driving circuit 13, an orthographic projection of the light-emitting control signal transmission lines EM-S on the base substrate 10 and an orthographic projection of the scanning driving circuit on the base substrate 10 may have overlap region with each other. For example, as shown in FIG. 14, the orthographic projection of the light-emitting control signal transmission lines EM-S on the base substrate 10 and an orthographic projection of the connecting part T17-T1 for the scanning driving transistor T17 in the second shifting register of the former-stage and the scanning driving transistor T1 in the second shifting register of the next-stage on the base substrate 10 may have overlap region with each other. In this way, the light-emitting control signal transmission lines EM-S of the light-emitting control circuit 14 are located at the first conducting layer, the distance between the first conducting layer and the fourth conducting layer is relatively long, and thus signal interference of the light-emitting control signal transmission lines EM-S on the scanning driving circuit may be reduced.

Based on the same inventive concept, an embodiment of the present disclosure further provides a preparation method of the above display panel, and the method may include the following steps: a first conducting layer 100, a second conducting layer 200 and a third conducting layer 300 are formed on a base substrate 10 in sequence to form a driving circuit located on the base substrate 10. The first conducting layer 100 includes a first electrode layer, the second conducting layer 200 includes a second electrode layer, and the third conducting layer 300 includes a third electrode layer.

An orthographic projection of the first electrode layer on the base substrate 10, an orthographic projection of the second electrode layer on the base substrate 10 and an orthographic projection of the third electrode layer on the base substrate 10 have an overlap region with one another. The first electrode layer and the third electrode layer are connected with each other to serve as a first electrode of a storage capacitor, and the second electrode layer serves as a second electrode of the storage capacitor.

During specific implementation, in the embodiment of the present disclosure, the second conducting layer 200 includes a first connecting lead insulated from the second electrode layer.

During specific implementation, in the embodiment of the present disclosure, after the first conducting layer 100 is formed and before the second conducting layer 200 is formed, the preparation method further includes: a first insulating layer 110 with the third via hole(s) is formed, wherein the first connecting lead is electrically connected with the first electrode layer through the third via hole(s) penetrating through the first insulating layer 110.

During specific implementation, in the embodiment of the present disclosure, after the second conducting layer 200 is formed and before the third conducting layer 300 is formed, the preparation method may further include: a second insulating layer 120 is formed.

During specific implementation, in the embodiment of the present disclosure, after the third conducting layer 300 is formed, the preparation method may further include:

a third insulating layer 130, first via holes penetrating through the third insulating layer 130 and second via holes penetrating through the second insulating layer 120 and the third insulating layer 130 are formed; and a fourth conducting layer 400 is formed. The fourth conducting layer 400 includes a second connecting lead, one end of the second connecting lead is electrically connected with the third electrode layer through the first via holes, and the other end of the second connecting lead is electrically connected with the first connecting lead through the second via holes.

It should be noted that the rest of via holes further formed in the first insulating layer 110 to the third insulating layer 130 may refer to the above described content, which is omitted herein.

Of course, other structures further included in the first conducting layer 100 to the fourth conducting layer 400 may refer to the above described content, which is omitted herein.

Various structures in the first conducting layer 100 to the fourth conducting layer 400 may be formed through a patterning process, and the via holes may be formed through an etching process. It should be noted that the patterning process may only include a photoetching process, or may include the photoetching process and an etching step and meanwhile may further include other processes such as printing and ink jetting for forming the preset pattern. The photoetching process refers to a process including technological processes such as film forming, exposure and developing and forming the pattern through photoresist, a mask plate, an exposure machine and the like. During specific implementation, the corresponding patterning process may be selected according to the structures formed in the present disclosure.

Based on the same inventive concept, an embodiment of the present disclosure further provides a display device, including the above display panel provided by the embodiment of the present disclosure. The principle of the display device to solve the problem is similar to that of the aforementioned display panel, thus the implementation of the display device may refer to the implementation of the aforementioned display panel, and repetitions are omitted herein.

During specific implementation, in the embodiment of the present disclosure, the display device may be: mobile phones, tablet computers, televisions, displays, notebook computers, digital photo frames, navigators and any other products or components with display functions. Other essential components of the display device should be understood and possessed by those of ordinary skill in the art, which is omitted herein, nor should it be construed as a limitation on the present disclosure.

According to the display panel, the preparation method thereof and the display device provided by the embodiments of the present disclosure, the first conducting layer includes the first electrode layer, the second conducting layer includes the second electrode layer, the third conducting layer includes the third electrode layer, and the orthographic projection of the first electrode layer on the base substrate, the orthographic projection of the second electrode layer on the base substrate and the orthographic projection of the third electrode layer on the base substrate have an overlap region with one another. In this way, the first electrode layer and the third electrode layer may be electrically connected with each other to serve as one electrode of the storage capacitor, the second electrode layer may serve as the other electrode of the storage capacitor, thus the storage capacitor may be formed in the sandwich capacitor mode, and the capacitance value of the storage capacitor may be increased. In other words, the first electrode layer and the second electrode layer may have the overlap region with each other to form one sub-capacitor of the storage capacitor, and the second electrode layer and the third electrode layer may have the overlap region with each other to form another sub-capacitor of the storage capacitor. The two sub-capacitors form the storage capacitor in a parallel-connection mode to increase the capacitance value of the storage capacitor.

Apparently, those of skill in the art may make various modifications and variations to the present disclosure without departing from the spirit and scope of the present disclosure. In this way, if these modifications and variations of the present disclosure fall within the scope of the claims of the present disclosure and their equivalent technologies, the present disclosure further intends to include these modifications and variations.

What is claimed is:

1. A display panel, comprising:
   a base substrate;
   a driving circuit located on the base substrate and comprising a storage capacitor;
   a first conducting layer;
   a second conducting layer;
   a third conducting layer;
   a first insulating layer located between the first conducting layer and the second conducting layer;
   a second insulating layer located between the second conducting layer and the third conducting layer;
   a third insulating layer located on a side, away from the base substrate, of the third conducting layer; and
   a fourth conducting layer located on a side, away from the base substrate, of the third insulating layer;
   wherein:
   the first conducting layer, the second conducting layer and the third conducting layer are sequentially located on the base substrate in a stacked mode, and are arranged on different layers;
   the first conducting layer comprises a first electrode layer, the second conducting layer comprises a second electrode layer, and the third conducting layer comprises a third electrode layer;
   an orthographic projection of the first electrode layer on the base substrate, an orthographic projection of the second electrode layer on the base substrate and an orthographic projection of the third electrode layer on the base substrate have an overlap region with one another;
   the first electrode layer and the third electrode layer are electrically connected with each other to serve as a first electrode of the storage capacitor, and the second electrode layer serves as a second electrode of the storage capacitor;
   the second conducting layer comprises a first connecting lead insulated from the second electrode layer;
   the fourth conducting layer comprises a second connecting lead; and
   one end of the second connecting lead is electrically connected with the third electrode layer through first via holes penetrating through the third insulating layer, another end of the second connecting lead is electrically connected with the first connecting lead through second via holes penetrating through the second insulating layer and the third insulating layer, and the first connecting lead is electrically connected with the first electrode layer through third via holes penetrating through the first insulating layer, so that the first electrode layer is electrically connected with the third electrode layer through the first connecting lead and the second connecting lead.

2. The display panel according to claim 1, wherein:
   the number of the first via holes is at least two; and/or,
   the number of the second via holes is at least two; and/or,
   the number of the third via holes is at least two.

3. The display panel according to claim 2, further comprising:
   a scanning driving circuit located in a non-display area;
   a light-emitting control circuit located in the non-display area; and
   a pixel circuit located in a display area;
   wherein:
   the driving circuit is at least one of: the scanning driving circuit, the light-emitting control circuit or the pixel circuit.

4. The display panel according to claim 1, wherein an orthographic projection of the second via holes on the base substrate and an orthographic projection of the third via holes on the base substrate are not overlapped with each other.

5. The display panel according to claim 4, further comprising:
   a scanning driving circuit located in a non-display area;
   a light-emitting control circuit located in the non-display area; and
   a pixel circuit located in a display area;
   wherein:
   the driving circuit is at least one of: the scanning driving circuit, the light-emitting control circuit or the pixel circuit.

6. The display panel according to claim 1, further comprising:
a scanning driving circuit located in a non-display area;
a light-emitting control circuit located in the non-display area; and
a pixel circuit located in a display area;
wherein:
the driving circuit is at least one of: the scanning driving circuit, the light-emitting control circuit or the pixel circuit.

7. The display panel according to claim 6, further comprising:
a plurality of light-emitting control signal lines located in the display area; and
a plurality of light-emitting control signal transmission lines located in the non-display area;
wherein:
each of the plurality of light-emitting control signal transmission lines is electrically connected with a corresponding light-emitting control signal line of the plurality of light-emitting control signal transmission lines;
a first signal output end of the light-emitting control circuit is electrically connected with each light-emitting control signal transmission line; and
the light-emitting control signal transmission lines are located at the first conducting layer.

8. The display panel according to claim 7, wherein:
the first insulating layer comprises:
a buffer layer located between the first conducting layer and the second conducting layer; and
a gate insulating layer located between the buffer layer and the second conducting layer;
the second conducting layer comprises a third connecting lead; and
the light-emitting control circuit comprises a light-emitting control transistor;
wherein:
an output end of the light-emitting control transistor is electrically connected with the third connecting lead through fourth via holes penetrating through the second insulating layer and the third insulating layer, and the third connecting lead is electrically connected with the light-emitting control signal transmission lines through fifth via holes penetrating through the buffer layer and the gate insulating layer, so that the light-emitting control signal transmission lines are electrically connected with the output end of the light-emitting control transistor through the third connecting lead.

9. The display panel according to claim 8, wherein:
the number of the fourth via holes is at least two; and/or,
the number of the fifth via holes is at least two; and/or,
an orthographic projection of the fourth via holes on the base substrate and an orthographic projection of the fifth via holes on the base substrate are not overlapped with each other.

10. The display panel according to claim 8, further comprising:
a first signal driving line; and
a first transmission line located in the non-display area;
wherein:
the first signal driving line is located at the fourth conducting layer, and the first transmission line is electrically connected with the light-emitting control circuit;
the first transmission line comprises a first sub-transmission line and a second sub-transmission line, the first sub-transmission line is located at the first conducting layer, and the second sub-transmission line is located at the second conducting layer; and
the first signal driving line is electrically connected with the second sub-transmission line through sixth via holes penetrating through the second insulating layer and the third insulating layer, and the second sub-transmission line is electrically connected with the first sub-transmission line through seventh via holes penetrating through the first insulating layer, so that the first signal driving line is electrically connected with the light-emitting control circuit through the first sub-transmission line and the second sub-transmission line.

11. The display panel according to claim 10, wherein:
the number of the sixth via holes is at least two; and/or
the number of the seventh via holes is at least two; and/or
an orthographic projection of the sixth via holes on the base substrate and an orthographic projection of the seventh via holes on the base substrate are not overlapped with each other.

12. The display panel according to claim 8, wherein:
the light-emitting control transistor is a double-gate transistor, and the light-emitting control transistor comprises a first bottom gate and a first top gate electrically connected with each other; and
the first bottom gate is located at the first conducting layer, and the first top gate is located at the second conducting layer.

13. The display panel according to claim 8, further comprising: a second signal driving line located in the non-display area and a second transmission line located in the non-display area;
the second transmission line comprises a third sub-transmission line and a fourth sub-transmission line, the third sub-transmission line is located at the first conducting layer, and the fourth sub-transmission line is located at the second conducting layer; and
the second signal driving line is electrically connected with the fourth sub-transmission line through eighth via holes penetrating through the second insulating layer and the third insulating layer, and the fourth sub-transmission line is electrically connected with the third sub-transmission line through ninth via holes penetrating through the first insulating layer, so that the second signal driving line is electrically connected with the scanning driving circuit through the third sub-transmission line and the fourth sub-transmission line.

14. The display panel according to claim 13, wherein:
the number of the eighth via holes is at least two; and/or,
the number of the ninth via holes is at least two; and/or,
an orthographic projection of the eighth via holes on the base substrate and an orthographic projection of the ninth via holes on the base substrate are not overlapped with each other.

15. The display panel according to claim 13, wherein the scanning driving circuit comprises a scanning driving transistor;
the scanning driving transistor is a double-gate transistor, and the scanning driving transistor comprises a second bottom gate and a second top gate electrically connected with each other; and
the second bottom gate is located at the first conducting layer, and the second top gate is located at the second conducting layer.

16. The display panel according to claim 7, wherein the light-emitting control circuit is located on a side, away from the display area, of the scanning driving circuit, and an orthographic projection of the light-emitting control signal transmission lines on the base substrate and an orthographic projection of the scanning driving circuit on the base substrate have an overlap region with each other.

17. A display device, comprising the display panel according to claim 1.

18. A preparation method for the display panel according to claim 1, comprising:
- forming the driving circuit located on the base substrate by forming the first conducting layer, the second conducting layer and the third conducting layer on the base substrate in sequence; wherein
- the first conducting layer comprises the first electrode layer, the second conducting layer comprises the second electrode layer, and the third conducting layer comprises the third electrode layer;
- the orthographic projection of the first electrode layer on the base substrate, the orthographic projection of the second electrode layer on the base substrate and the orthographic projection of the third electrode layer on the base substrate have the overlap region with one another; and
- the first electrode layer and the third electrode layer are electrically connected with each other to serve as the first electrode of the storage capacitor, and the second electrode layer serves as the second electrode of the storage capacitor.

19. The preparation method according to claim 18, wherein the second conducting layer comprises a first connecting lead insulated from the second electrode layer;
- after the first conducting layer is formed and before the second conducting layer is formed, the preparation method further comprises: forming a first insulating layer with third via holes; wherein the first connecting lead is electrically connected with the first electrode layer through the third via holes penetrating through the first insulating layer;
- after the second conducting layer is formed and before the third conducting layer is formed, the preparation method further comprises: forming a second insulating layer; and
- after the third conducting layer is formed, the preparation method further comprises:
- forming a third insulating layer, first via holes penetrating through the third insulating layer and second via holes penetrating through the second insulating layer and the third insulating layer; and
- forming a fourth conducting layer; wherein the fourth conducting layer comprises a second connecting lead, one end of the second connecting lead is electrically connected with the third electrode layer through the first via holes, and another end of the second connecting lead is electrically connected with the first connecting lead through the second via holes.

* * * * *